(12) United States Patent
Mao et al.

(10) Patent No.: US 12,543,403 B2
(45) Date of Patent: Feb. 3, 2026

(54) SOLAR CELL, METHOD FOR PREPARING SOLAR CELL, AND PHOTOVOLTAIC MODULE

(71) Applicants: ZHEJIANG JINKO SOLAR CO., LTD., Zhejiang (CN); JINKO SOLAR CO., LTD., Jiangxi (CN)

(72) Inventors: Jie Mao, Zhejiang (CN); Jingming Zheng, Zhejiang (CN); Zhao Wang, Zhejiang (CN); Jie Yang, Zhejiang (CN); Peiting Zheng, Zhejiang (CN); Xinyu Zhang, Zhejiang (CN)

(73) Assignees: ZHEJIANG JINKO SOLAR CO., LTD., Haining (CN); JINKO SOLAR CO., LTD., Jiangxi (CN)

( * ) Notice: Subject to any disclaimer, the term of this patent is extended or adjusted under 35 U.S.C. 154(b) by 0 days.

(21) Appl. No.: 18/639,936

(22) Filed: Apr. 18, 2024

(65) Prior Publication Data

US 2025/0204086 A1    Jun. 19, 2025

(30) Foreign Application Priority Data

Dec. 15, 2023    (CN) .......................... 202311738300.5

(51) Int. Cl.
*H10F 77/70* (2025.01)
*H10F 10/14* (2025.01)

(52) U.S. Cl.
CPC ........... *H10F 77/703* (2025.01); *H10F 10/14* (2025.01)

(58) Field of Classification Search
CPC ........ H10F 10/14; H10F 10/65; H10F 77/211; H10F 77/311; H10F 77/703
See application file for complete search history.

(56) References Cited

U.S. PATENT DOCUMENTS

| | | | | |
|---|---|---|---|---|
| 5,024,953 A | * | 6/1991 | Uematsu | H10F 77/703 257/E23.179 |
| 5,248,621 A | * | 9/1993 | Sano | H10F 77/703 148/DIG. 12 |

(Continued)

FOREIGN PATENT DOCUMENTS

| | | |
|---|---|---|
| AU | 2022206808 B1 | 11/2023 |
| AU | 2023258335 A1 | 11/2023 |

(Continued)

OTHER PUBLICATIONS

Zhejiang Jinko Solar Co., Ltd. et al., Extended European Search Report, EP 24170779.3, Oct. 4, 2024, 40 pgs.

(Continued)

*Primary Examiner* — Golam Mowla
(74) *Attorney, Agent, or Firm* — USCH Law, PC

(57) ABSTRACT

A solar cell is provided, including a substrate having a first surface and a second surface, the first surface having a textured structure including protrusion structures, at least one doped semiconductor layer each formed over one of the first surface and the second surface, at least one passivation film each formed on a respective doped semiconductor layer, and electrodes penetrating a respective passivation film to be in electrical contact with the respective doped semiconductor layer. Each doped semiconductor layer has a surface facing away from the substrate and provided with recesses, and each recess has a size that is smaller than a size of any of the protrusion structures. Each passivation film has at least one portion formed in at least one of the recesses, and each electrode has at least one portion formed in at least one of the recesses.

19 Claims, 9 Drawing Sheets

(56) References Cited

U.S. PATENT DOCUMENTS

| | | | |
|---|---|---|---|
| 6,114,046 | A | 9/2000 | Hanoka |
| 9,525,083 | B2 | 12/2016 | Westerberg et al. |
| 9,871,152 | B2 * | 1/2018 | Nishiyama .......... H10F 77/1645 |
| 11,848,397 | B1 | 12/2023 | Jin et al. |
| 2003/0178057 | A1 * | 9/2003 | Fujii .................... H10F 77/211 |
| | | | 136/246 |
| 2009/0308438 | A1 | 12/2009 | De Ceuster et al. |
| 2011/0214724 | A1 * | 9/2011 | Seo ...................... H10F 77/211 |
| | | | 136/255 |
| 2013/0130508 | A1 | 5/2013 | Wu et al. |
| 2013/0295712 | A1 | 11/2013 | Chen et al. |
| 2014/0299187 | A1 | 10/2014 | Chang et al. |
| 2017/0200850 | A1 | 7/2017 | Lee et al. |
| 2018/0315866 | A1 | 11/2018 | Cheong et al. |
| 2019/0267499 | A1 | 8/2019 | Smith et al. |
| 2020/0135944 | A1 | 4/2020 | Yi et al. |
| 2020/0287066 | A1 | 9/2020 | Stodolny et al. |
| 2020/0411713 | A1 * | 12/2020 | Mishima .............. H10F 77/703 |
| 2022/0262967 | A1 | 8/2022 | Kim et al. |
| 2022/0376124 | A1 | 11/2022 | Feng et al. |
| 2023/0037129 | A1 | 2/2023 | Prusik et al. |
| 2023/0187564 | A1 | 6/2023 | Jin et al. |
| 2023/0402553 | A1 | 12/2023 | Chen et al. |

FOREIGN PATENT DOCUMENTS

| | | |
|---|---|---|
| CN | 206595264 U | 10/2017 |
| CN | 108336154 A | 7/2018 |
| CN | 110676160 A | 1/2020 |
| CN | 210897294 U | 6/2020 |
| CN | 111739984 A | 10/2020 |
| CN | 111755552 A | 10/2020 |
| CN | 113327999 A | 8/2021 |
| CN | 114388639 A | 4/2022 |
| CN | 114784148 A | 7/2022 |
| CN | 115566088 A | 1/2023 |
| CN | 218585994 U | 3/2023 |
| CN | 218975458 U | 5/2023 |
| CN | 116632093 A | 8/2023 |
| CN | 116741849 A | 9/2023 |
| EP | 4290588 A1 | 12/2023 |
| JP | 2005142268 A | 6/2005 |
| JP | 2014204128 A | 10/2014 |
| JP | 2015082512 A | 4/2015 |
| JP | 2015515747 A | 5/2015 |
| JP | 2015149500 A | 8/2015 |
| JP | 2015185587 A | 10/2015 |
| JP | 2016006907 A | 1/2016 |
| JP | 2016012687 A | 1/2016 |
| JP | 2016139834 A | 8/2016 |
| JP | 2016225627 A | 12/2016 |
| JP | 2017120906 A | 7/2017 |
| JP | 2017520920 A | 7/2017 |
| JP | 2018026574 A | 2/2018 |
| JP | 2018107480 A | 7/2018 |
| JP | 2018129511 A | 8/2018 |
| JP | 2019220725 A | 12/2019 |
| JP | 2020043255 A | 3/2020 |
| JP | 2020129666 A | 8/2020 |
| JP | 2022501837 A | 1/2022 |
| JP | 2022058069 A | 4/2022 |
| JP | 7381687 B1 | 11/2023 |
| JP | 2023174428 A | 12/2023 |
| KR | 101740523 B1 | 5/2017 |
| KR | 101930640 B1 | 12/2018 |
| WO | 2015141326 A1 | 9/2015 |
| WO | 2017163520 A1 | 9/2017 |
| WO | 2019116031 A1 | 6/2019 |
| WO | 2019163646 A1 | 8/2019 |

OTHER PUBLICATIONS

Zhejiang Jinko Solar Co., Ltd. et al., Non-Final Rejection, U.S. Appl. No. 18/593,812, Sep. 10, 2024, 35 pgs.
Zhejiang Jinko Solar Co., Ltd., Extended European Search Report, EP 24160410.7, Jul. 23, 2024, 9 pgs.
Zhejiang Jinko Solar Co., Ltd., et al., Final-Rejection, U.S. Appl. No. 18/582,627, Sep. 27, 2024, 35 pgs.
Zhejiang Jinko Solar Co., Ltd. et al., Extended European Search Report, EP 24159209.6, Aug. 19, 2024, 73 pgs.
Zhejiang Jinko Solar Co., Ltd. et al., Notice of Allowance, U.S. Appl. No. 18/424,563, Jul. 31, 2024, 15 pgs.
Zhejiang Jinko Solar Co., Ltd. et al., Extended European Search Report, EP 24153724.0, Aug. 16, 2024, 7 pgs.
Zhejiang Jinko Solar Co., Ltd. et al., JP Decision to Grant a Patent, JP 2024-025972, Nov. 18, 2024, 5 pgs.
Andrea Ingenito, et al., "Silicon Solar Cell Architecture with Front Selective and Rear Full Area Ion-Implanted Passivating Contacts", Solar RRL, vol. 1, Article No. 1700040, 2017, 6 pgs.
Zhejiang Jinko Solar Co., Ltd. et al. Non Final Rejection, U.S. Appl. No. 18/582,627, Jun. 13, 2024, 26 pgs.

* cited by examiner

SOLAR CELL, METHOD FOR PREPARING SOLAR CELL, AND PHOTOVOLTAIC MODULE

CROSS-REFERENCE TO RELATED APPLICATION

The present disclosure claims the benefit of priority under the Paris Convention to Chinese Patent Application 202311738300.5 filed on Dec. 15, 2023, which is incorporated herein by reference in its entirety.

TECHNICAL FIELD

Embodiments of the present disclosure relate in general to the field of solar cells, and more specifically to a solar cell, a method for preparing a solar cell and a photovoltaic module.

BACKGROUND

Currently, with gradual depletion of fossil energy sources, solar cells are being used more and more widely as a new energy alternative, which convert light energy from the sun into electrical energy. The solar cells utilize the photovoltaic principle to generate carriers, and then use electrodes to draw the carriers out, thereby facilitating efficient utilization of the electrical energy.

Solar cells generally include passivation films that saturate surface dangling bonds and lower the interfacial state. For example, silicon nitride $SiN_x$ not only saturates the surface dangling bonds and lowers the interfacial state, but also reduces concentration of minority carriers in N-type silicon on the front surface through its own positive charges, thus lowering the surface recombination rate. Hydrogen carried in the prepared $SiN_x$ can diffuse into a silicon wafer during sintering to passivate an emitter and internal crystal defects of the silicon wafer.

However, passivation films of solar cells prepared in conventional preparation process have residual stress, which can directly affect adhesion of the passivation film to a substrate (a film layer covered by the passivation film), and excessive tensile or compressive stress causes cracking or warping of the passivation film, which affects the passivation effect of the passivation film, so that the photovoltaic conversion efficiency of the solar cell is reduced accordingly.

SUMMARY

Some embodiments of the present disclosure provide a solar cell, a method for preparing a solar cell, and a photovoltaic module, which are at least conducive to photoelectric conversion efficiency of the solar cell.

Some embodiments of the present disclosure provide a solar cell, including: a substrate having a first surface and a second surface opposite to each other, where the first surface has a textured structure, and the textured structure includes protrusion structures; at least one doped semiconductor layer each formed over one of the first surface and the second surface, where each of the at least one doped semiconductor layer has a surface facing away from the substrate and provided with recesses, and each of the recesses has a size that is smaller than a size of any of the protrusion structures; at least one passivation film, a respective passivation film of the at least one passivation film being formed on a respective doped semiconductor layer of the at least one doped semiconductor layer and having at least one portion formed in at least one of the recesses of the respective doped semiconductor layer; and electrodes penetrating the respective passivation film to be in electrical contact with the respective doped semiconductor layer, where the electrodes have at least one portion formed in at least one of the recesses of the respective doped semiconductor layer.

In some embodiments, the recesses have orthographic projections on one of the first surface and the second surface, the orthographic projections having a first area, and the surface of the doped semiconductor layer has an orthographic projection on one of the first surface and the second surface, the orthographic projection having a second area; and where the first area and the second area has a ratio in a range of 5% to 80%.

In some embodiments, the respective doped semiconductor layer has a material including polysilicon, monocrystalline silicon, nanocrystalline silicon, amorphous silicon, or microcrystalline silicon.

In some embodiments, the respective doped semiconductor layer has a thickness in a range of 10 nm to 200 nm.

In some embodiments, the size of each of the recesses includes a one-dimensional size of an orthographic projection of each of the recesses on a surface of the respective doped semiconductor layer facing the substrate, and the one-dimensional size is in a range of 5 nm to 100 nm.

In some embodiments, each of the recesses has a depth in a range of 5 nm to 100 nm.

In some embodiments, the doped semiconductor layer includes silicon grains, and a junction of two adjacent silicon grains has respective ones of the recesses.

In some embodiments, each of the silicon grains has a sheet shape or a block shape.

In some embodiments, the at least one doped semiconductor layer includes a first doped conductive film and a second doped conductive film, the first doped conductive film is formed on the textured structure, and the second doped conductive film is formed over the second surface; and where at least one of the first doped conductive film and the second doped conductive film has the recesses.

In some embodiments, the at least one doped semiconductor layer includes a first doped conductive film and a second doped conductive film, and the first doped conductive film and the second doped conductive film are alternatingly formed over the second surface; and where at least one of the first doped conductive film and the second doped conductive film has the recesses.

In some embodiments, the first doped conductive film is doped with one of an N-type doping element and a P-type doping element, and the second doped conductive film is doped with one of the N-type doping element and the P-type doping element.

In some embodiments, the first doped conductive film has a material that is different from a material of the second doped conductive film, and the second doped conductive film and the substrate have a same conductive type of doping elements.

In some embodiments, the solar cell further includes a first dielectric layer formed between the second doped conductive film and the second surface, and a second dielectric layer formed between the first doped conductive film and the substrate.

In some embodiments, at least one of the first dielectric layer and the second dielectric layer has a material including silicon oxide, amorphous silicon, microcrystalline silicon, nanocrystalline silicon, or silicon carbide.

In some embodiments, the first doped conductive film has a thickness that is less than or equal to a thickness of the second doped conductive film.

Some embodiments of the present disclosure further provide a method for preparing a solar cell, including: providing a substrate having a first surface and a second surface opposite to each other, where the first surface has a textured structure, and the textured structure includes protrusion structures; at least one doped semiconductor layer each formed over one of the first surface and the second surface, where each of the at least one doped semiconductor layer has a surface facing away from the substrate and provided with recesses, and each of the recesses has a size that is smaller than a size of any of the protrusion structures; at least one passivation film, a respective passivation film of the at least one passivation film being formed on a respective doped semiconductor layer of the at least one doped semiconductor layer and having at least one portion formed in at least one of the recesses of the respective doped semiconductor layer; and electrodes penetrating the respective passivation film to be in electrical contact with the respective doped semiconductor layer, where the electrodes have at least one portion formed in at least one of the recesses of the respective doped semiconductor layer.

Some embodiments of the present disclosure further provide a photovoltaic module including: at least one cell string each formed by connecting a plurality of solar cells according to any one of the above embodiments through at least one connecting member; at least one encapsulation layer each configured to cover a surface of a respective cell string; and at least one cover plate each configured to cover a surface of a respective encapsulating adhesive film facing away from the respective cell string.

BRIEF DESCRIPTION OF THE DRAWINGS

One or more embodiments are exemplarily described with figures in the accompanying drawings corresponding thereto, which are not intended to limit these embodiments. Unless otherwise stated, the figures in the accompanying drawings do not constitute scale limitations. In order to more clearly illustrate the technical solutions in the embodiments of the present disclosure or conventional technologies, the accompanying drawings that need to be used in the embodiments are briefly described below, and it is apparent that the drawings in the following description are merely some embodiments of the present disclosure. For a person of ordinary skill in the art, other drawings may also be obtained according to these drawings.

DETAILED DESCRIPTION OF THE EMBODIMENTS

It is seen from the background that the conventional solar cell has a poor the photoelectric conversion efficiency.

Figure 1:
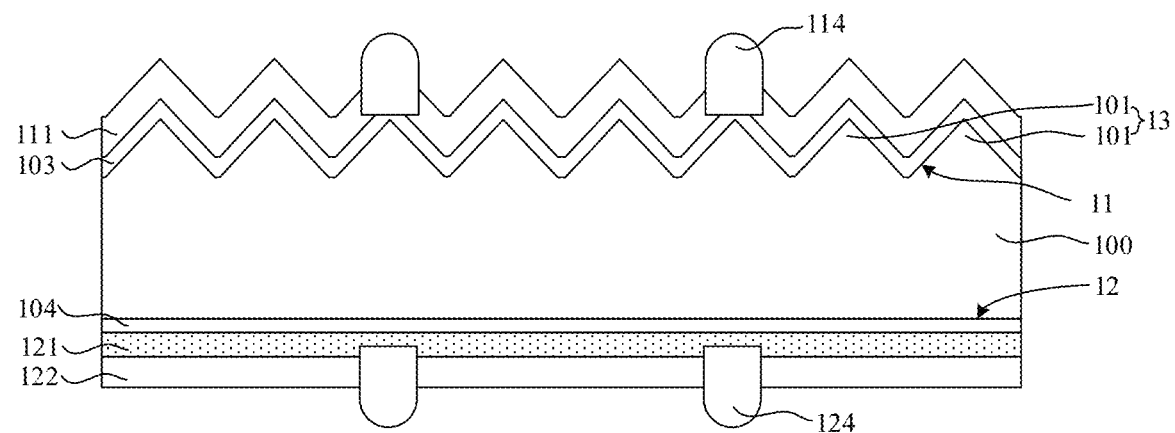
FIG. 1 is a schematic structural diagram of a solar cell.
Figure 2A:
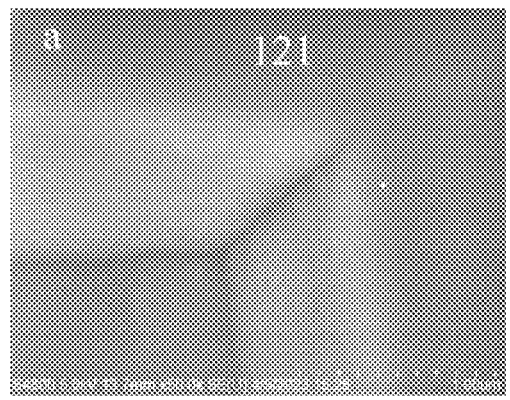
FIG. 2A is a scanning electron microscope image of a doped semiconductor film in a solar cell.
Figure 2B:
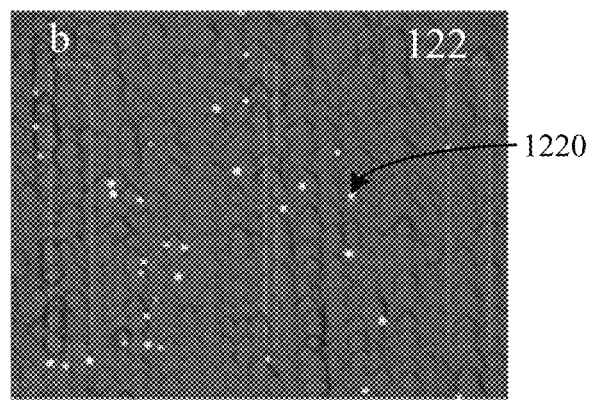
FIG. 2B is a scanning electron microscope image of an optical microscope image of a passivation film in a solar cell.

One of the reasons for the poor photoelectric conversion efficiency of the conventional solar cell is as follows. FIG. 1 is a schematic structural diagram of a solar cell, and as shown in FIG. 1, the solar cell includes an emitter 103 formed on a front surface of a substrate 100, a passivation layer 111, fingers 114, a dielectric layer 104 formed on a rear surface 12 of the substrate, a doped semiconductor film 121, a passivation film 122, and electrodes 124. FIG. 2A shows a morphology of a surface of the doped semiconductor film 121, and it can be seen from FIG. 2A that the surface of doped semiconductor film 121 is relatively flat, and pyramid structures formed by a texturing treatment are left with morphologies of tower bases having lower heights after being polished, i.e., spires thereof have been etched away. FIG. 2B shows a morphology of a surface of the passivation film 122, and it can be seen from FIG. 2B that the passivation film covers the doped semiconductor film and has a morphology is conformal in the tower base morphology on the rear surface of the substrate. It can be seen from FIG. 2B that the passivation film has stress points 1220, and the stress of the passivation film 122 itself is large, which may cause problems such as film explosion on the surface of the passivation film 122 or separation of the passivation film 122 from the doped semiconductor film 121 in subsequent processes, and even cause problems such as hydrogen passivation failure and abnormal appearance, thereby affecting the yield and photoelectric conversion efficiency of the solar cell.

The reasons why the stress of the passivation film is large are described as follows. A difference between thermal expansion coefficients of the passivation film and the doped semiconductor film is large, i.e., a deformation degree of the passivation film and a deformation degree of the doped semiconductor film cannot be cancelled with each other, so that the deformation degree of the passivation film is relatively large, and then compressive stress or tensile stress occurs. When the compressive stress or tensile stress exceeds an elastic limit of the passivation film, the passivation film may burst. According to a film growth theory, a surface of the doped semiconductor film is in a relatively flat state, the passivation film first changes from a crystal nucleus stage to an island stage, and then develops into a network stage until channels are filled to become a continuous film. In this process, sizes of crystal grains for forming the passivation film are small, so that an area of a grain boundary between two crystal grains is increased, and then the stress is also correspondingly increased.

Embodiments of the present disclosure provide a solar cell. A surface of a doped semiconductor layer facing away from a substrate is provided with recesses, and the recesses may buffer a deformation difference caused by the difference between thermal expansion coefficients of the doped semiconductor layer and the passivation film, so as to buffer a stress of the passivation film, thereby reducing a defect rate of the passivation film. The doped semiconductor layer has recesses, so that grains constituting the passivation film may migrate in a nucleation process, and gather and grow in the recesses or near the recesses, so that the difficulty of network-like development after the island shape is increased, agglomeration continues so as to form more coarse grain agglomeration, thereby reducing the area of the grain boundary between grains forming the passivation film and reducing the stress. The doped semiconductor layer has recesses, so that roughness of the doped semiconductor layer is correspondingly increased, a specific surface area of the doped semiconductor layer is increased, surface energy of a surface of the substrate is increased, nucleation density of the passivation film on a heterogeneous doped semiconductor layer is improved, and meanwhile, the adhesion between the passivation film and the doped semiconductor layer is enhanced. Here, "heterogeneous" means that a material of the passivation film is different from a material of the doped semiconductor layer and has characteristics such as band width, affinity, and conduction band level.

In addition, the doped semiconductor layer has recesses, and a size of each of the recesses is smaller than a size of any of the protrusion structures, so that the doped semiconductor layer does not have large defects or generates holes to make the passivation film be in close contact with the doped semiconductor layer, thereby improving adhesive force and the bonding force between the doped semiconductor layer and the passivation film.

The recesses enhance internal reflection of incident light, thereby reducing optical loss of the cell. At least one portion of the electrode is formed in at least one of the recesses, so that the design of the recesses enhances a contact area between the electrode paste and the doped semiconductor layer, thereby improving contact performance between the doped semiconductor layer and the electrode.

The following describes embodiments of the present disclosure in detail with reference to the accompanying drawings. A person of ordinary skill in the art may understand that, in the embodiments of the present disclosure, in order to make the reader better understand the present disclosure, many technical details are provided. However, even without these technical details and various changes and modifications based on the following embodiments, the technical solutions claimed in the present disclosure may also be implemented.

Figure 3:
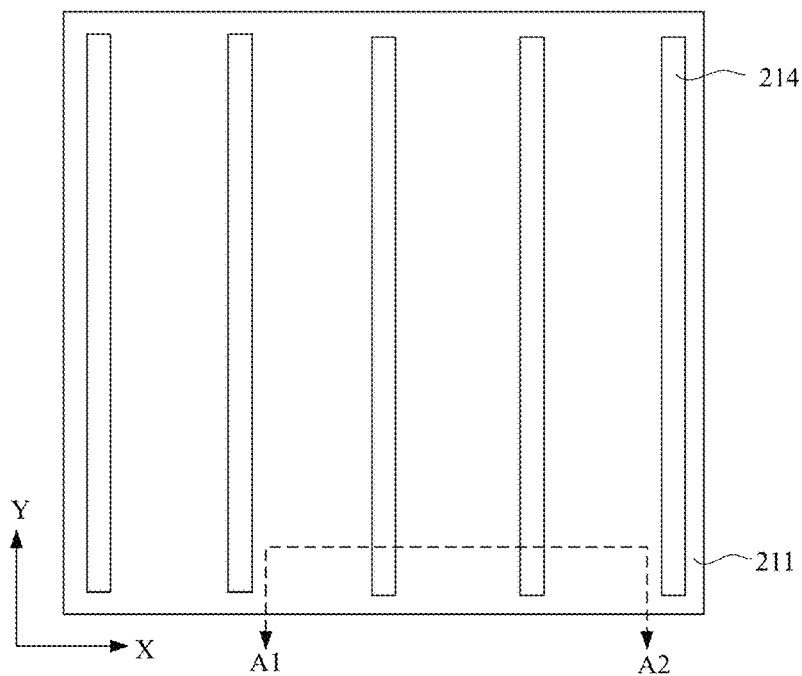
FIG. 3 is a schematic structural diagram of a first solar cell according to an embodiment of the present disclosure.
Figure 4:
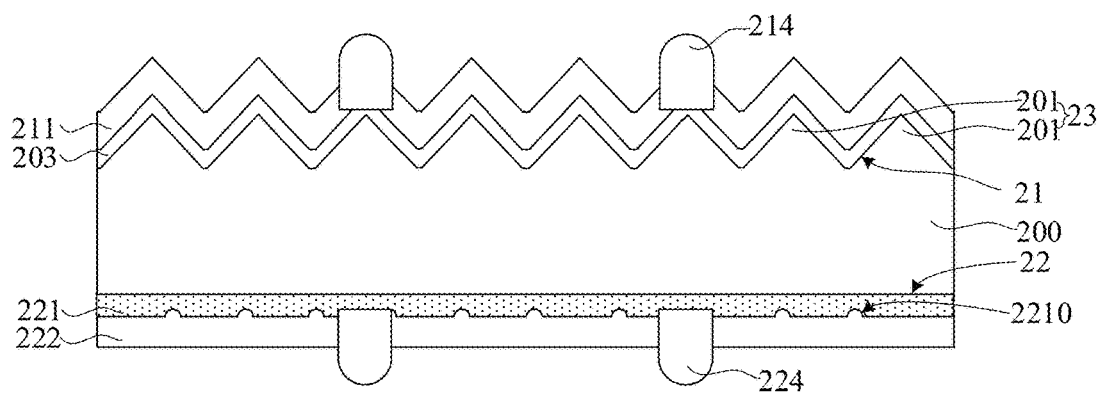
FIG. 4 is a first cross-sectional view of FIG. 3 taken along line A1-A2.
Figure 5:
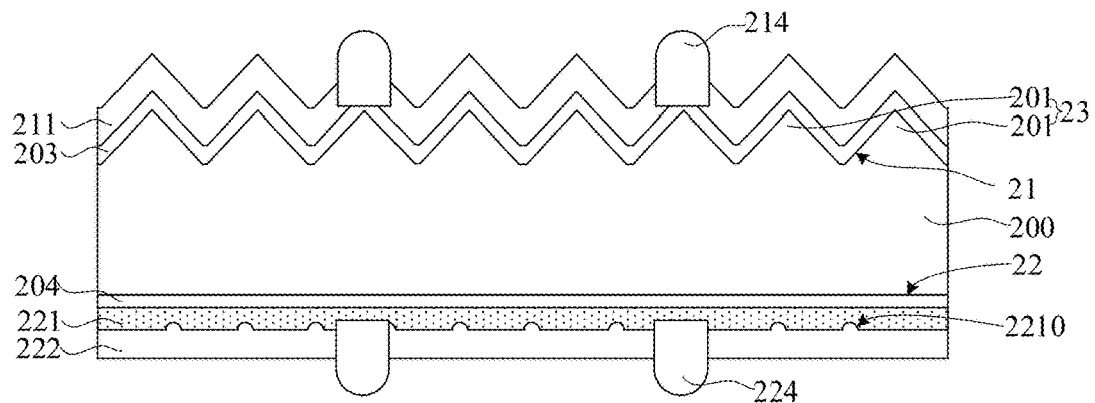
FIG. 5 is a second cross-sectional view of FIG. 3 taken along line A1-A2.
Figure 6:
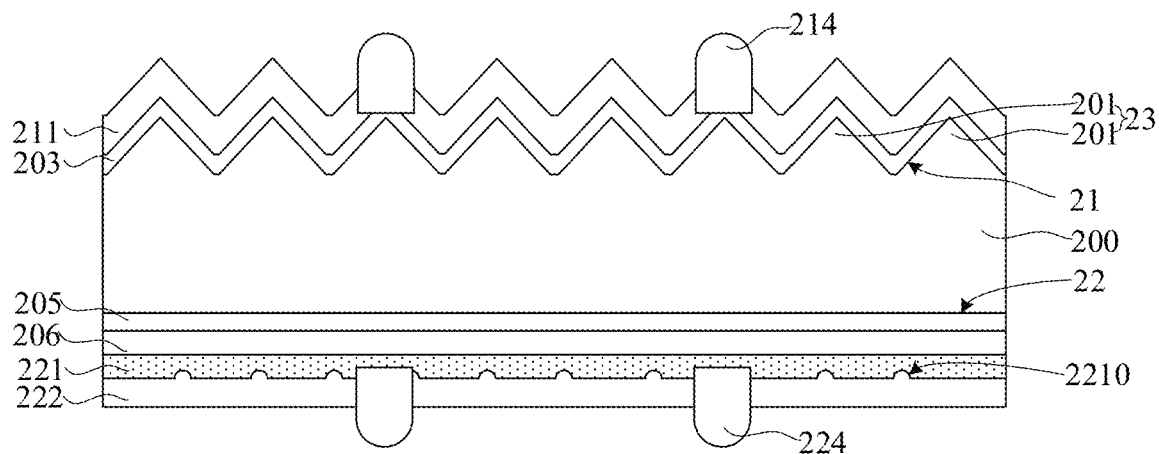
FIG. 6 is a third cross-sectional view of FIG. 3 taken along line A1-A2.
Figure 7A:
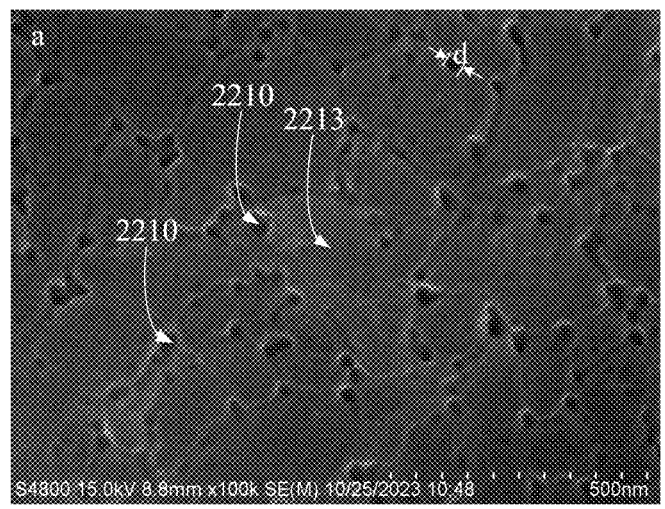
FIG. 7A is a scanning electron microscope image of a doped semiconductor layer in a solar cell provided in an embodiment of the present disclosure.
Figure 7B:
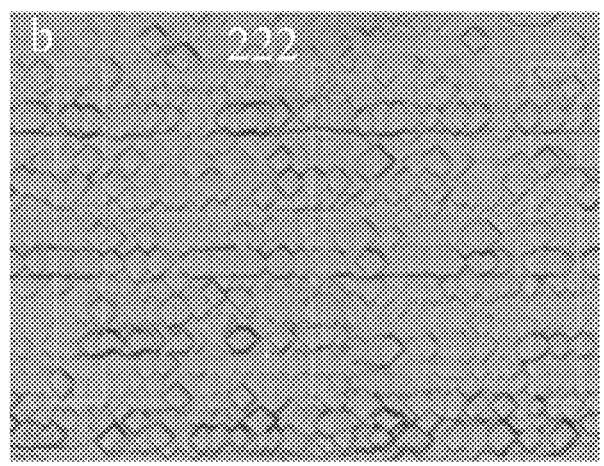
FIG. 7B is an optical microscope image of a passivation film in a solar cell provided in an embodiment of the present disclosure.
Figure 8:
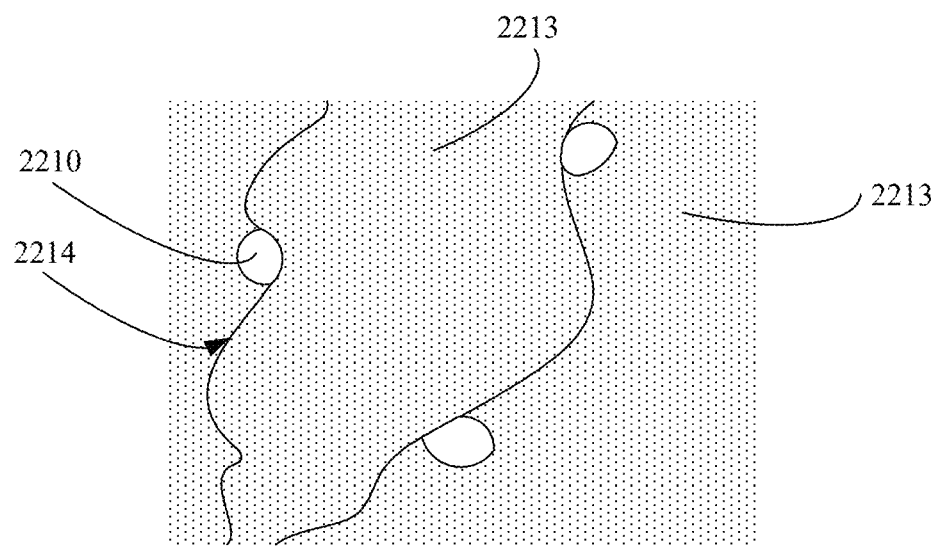
FIG. 8 is a partial structural diagram of a doped semiconductor layer in a solar cell according to an embodiment of the present disclosure.

FIG. 3 is a schematic structural diagram of a solar cell according to an embodiment of the present disclosure. FIG. 4 is a first cross-sectional view of FIG. 3 taken along line A1-A2. FIG. 5 is a second cross-sectional view of FIG. 3 taken along line A1-A2. FIG. 6 is a third cross-sectional view of FIG. 3 taken along line A1-A2. FIG. 7A is a scanning electron microscope image of a doped semiconductor layer in a solar cell provided in an embodiment of the present disclosure. FIG. 7B is an optical microscope image of a passivation film in a solar cell provided in an embodiment of the present disclosure. FIG. 8 is a partial structural diagram of a doped semiconductor layer in a solar cell according to an embodiment of the present disclosure.

Referring to FIG. 4, some embodiments of the present disclosure provide a solar cell including a substrate 200 having a first surface 21 and a second surface 22 disposed opposite to each other, the first surface 21 has a textured structure 23, and the textured structure 23 includes protrusion structures 201. The solar cell further includes a doped semiconductor layer 221 formed over the second surface 22, a passivation film 222 formed on the doped semiconductor layer 221, and electrodes 224 penetrating the passivation film 222 to be in electrical contact with the doped semiconductor layer 221. A surface of the doped semiconductor layer 221 facing away from the substrate 200 is provided with a plurality of recesses 2210, and a size of each recess 2210 is smaller than a size of any of the protrusion structures 201. At least one portion of the passivation film 222 is formed in at least one of the recesses 2210, and at least one portion of the electrode 224 is formed in at least one of the recesses 2210.

In some embodiments, a material of the substrate 200 includes an elemental semiconductor material. Specifically, the elemental semiconductor material is composed of a single element, for example, silicon or germanium. The elemental semiconductor material may be in a single crystal state, a polycrystalline state, an amorphous state, or a microcrystalline state (i.e., having the single crystal state and the amorphous state at the same time). For example, silicon may be at least one of single crystalline silicon, polysilicon, amorphous silicon, or microcrystalline silicon.

In some embodiments, the material of the substrate 200 includes a compound semiconductor material. Conventional compound semiconductor materials include, but are not limited to, silicon germanium, silicon carbide, gallium arsenide, indium gallium arsenide, perovskite, cadmium telluride, copper indium selenium and other materials. The substrate 200 may also be a sapphire substrate, a silicon substrate on an insulator, or a germanium substrate on the insulator.

In some embodiments, the substrate 200 may be an N-type semiconductor substrate or a P-type semiconductor substrate. The N-type semiconductor substrate is doped with an N-type doping element, and the N-type doping element may be any one of group V elements such as phosphorus (P), bismuth (Bi), antimony (Sb), or arsenic (As). The P-type semiconductor substrate is doped with a P-type doping element, and the P-type doping element may be any one of group III elements such as boron (B), aluminum (Al), gallium (Ga), or indium (In).

In some embodiments, the first surface 21 of the substrate 200 is a front surface and the second surface 22 is a rear surface, or, the first surface of the substrate is the rear surface and the second surface is the front surface. The front surface is a light receiving surface for receiving incident light, and the rear surface is a backlight surface. In some embodiments, the solar cell is a double-sided cell, that is, both the first surface and the second surface of the substrate are light receiving surfaces for receiving incident light. The backlight surface is also capable of receiving incident light, but the efficiency of receiving the incident light from the backlight surface is weaker than the efficiency of receiving the incident light from the light receiving surface.

In the solar cell shown in FIG. 4 to FIG. 6, the first surface of the substrate is the front surface, and the second surface of the substrate is the rear surface. The technical solutions of the solar cell shown in FIG. 4 to FIG. 6 are improvements on the rear surface of the solar cell, and the doped semiconductor layer is formed over the rear surface of the substrate, thereby improving the passivation performance of the rear surface of the solar cell. In the solar cell shown in FIG. 4 to FIG. 6, a side of a substrate facing upward serves as a light receiving surface, and a side of the substrate facing downward serves as a backlight surface.

Referring to FIG. 4, the solar cell further includes a first doped layer 203 formed on the first surface 21 of the substrate 200, and the doped semiconductor layer 221 is formed on the second surface 22 of the substrate 200. The solar cell includes a passivation layer 211 and fingers 214, and the fingers 214 penetrate the passivation layer 211 to be in electrical contact with the first doped layer 203.

In some embodiments, the first doped layer 203 and the substrate 200 are prepared by a doping process on the same original substrate, the first doped layer 203 is doped with one of an N-type doping element and a P-type doping element, and the doped semiconductor layer 221 is doped with the other of the N-type doping element and the P-type doping element.

In some embodiments, the substrate is an N-type substrate, the first doped layer 203 is doped with the P-type doping element, the doped semiconductor layer 221 is doped with the N-type doping element, so that a PN junction is formed between the substrate and the first doped layer, a doping element concentration of the doped semiconductor layer 221 is greater than a doping element concentration of the substrate, and a high-low junction is formed between the substrate and the doped semiconductor layer 221.

In some embodiments, a material of the doped semiconductor layer 221 is the same as a material of the substrate 200, and the material of the doped semiconductor layer 221 includes crystalline silicon, such that no interface threshold difference exists between the doped semiconductor layer 221 and the substrate 20, and a bonding force between the doped semiconductor layer 221 and the substrate is good.

In some embodiments, the substrate is an N-type substrate, the doped semiconductor layer 221 is doped with the P-type doping element, the first doped layer 203 is doped with the N-type doping element, so that a PN junction is formed between the substrate and the doped semiconductor layer 221, a doping element concentration of the doped semiconductor layer 221 is greater than a doping element concentration of the substrate, and a high-low junction is formed between the substrate and the doped semiconductor layer 221.

Referring to FIG. 5, the solar cell further includes a tunneling dielectric layer 204 is formed between the doped semiconductor layer 221 and the second surface 22, and the doped semiconductor layer 221 may be a doped polysilicon layer.

In some embodiments, a passivation contact structure is formed between the tunneling dielectric layer 204 and the doped polysilicon layer, the doped polysilicon layer can form band bending on the surface of the substrate 200, and the tunneling dielectric layer 204 causes an asymmetric shift of the band on the surface of the substrate 200, so that potential barrier for majority carriers is lower than potential barrier for minority carriers, and therefore, the majority carriers can pass through the tunneling dielectric layer 204 for quantum tunneling more easily, while the minority carriers have difficulty in passing through the tunneling dielectric layer 204, so as to achieve selective transport of carriers.

In addition, the tunneling dielectric layer 204 has a chemical passivation effect. Specifically, as interface state defects exist at an interface of the substrate 200 and the first tunneling dielectric layer, interface state density of the front surface of the substrate 200 is large, the increase of the interface state density promotes recombination of photon-generated carriers, and increases the filling factor, the short-circuit current and the open-circuit voltage of the solar cell, so that the photoelectric conversion efficiency of the solar cell is improved. The tunneling dielectric layer 204 is provided on the first surface 21 of the substrate 200, so that the tunneling dielectric layer 204 has the chemical passivation effect on the rear surface of the substrate 200. Specifically, the defect state density of the substrate 200 is reduced by saturating dangling bonds of the substrate 200, and the carrier recombination rate is reduced by reducing the recombination center of the substrate 200.

In some embodiments, the tunneling dielectric layer 204 has a thickness in a range of 0.5 nm to 5 nm. For example, the thickness of the tunneling dielectric layer 204 has a range of 0.5 nm to 1.3 nm, 1.3 nm to 2.6 nm, 2.6 nm to 4.1 nm, or 4.1 nm to 5 nm. Within any of the above ranges, the thickness of the tunneling dielectric layer 204 is a relatively small, so that the majority carriers can pass through the tunneling dielectric layer 204 for quantum tunneling more easily, while the minority carriers have difficulty in passing through the tunneling dielectric layer 204, so as to achieve selective transport of carriers.

The doped polysilicon layer has a field passivation effect. Specifically, an electrostatic field directed to the interior of the substrate 200 is formed on the surface of the substrate 200 to enable minority carriers to escape from the interface, so that concentration of the minority carriers is reduced, the carrier recombination rate at the interface of the substrate 100 is reduced, the open-circuit voltage, the short-circuit current and the filling factor of the solar cell are increased, and the photoelectric conversion efficiency of the solar cell is improved.

The doped polysilicon layer is doped with the doping element of the same type as the doping element in the substrate 200, for example, the type of the doping element in the substrate 200 is N-type.

In some embodiments, a material of the tunneling dielectric layer 204 includes silicon oxide, amorphous silicon, microcrystalline silicon, nanocrystalline silicon, or silicon carbide.

Referring to FIG. 6, the solar cell further includes an intrinsic dielectric layer 205 and a doped amorphous silicon layer 206 formed between the doped semiconductor layer 221 and the second surface 22. The intrinsic dielectric layer 205 is formed on the second surface 22, and the doped amorphous silicon layer 206 is formed on the intrinsic dielectric layer 205. The doped semiconductor layer 221 is a transparent conductive layer, and a material of the transparent conductive layer includes at least one of indium tin oxide (ITO), aluminum-doped zinc oxide (AZO), cerium-doped indium oxide, and tungsten-doped indium oxide.

It should be noted that the doping element in the transparent conductive layer is not the P-type doping element and the N-type doping element, and the transparent conductive layer is an N-type semiconductor or a P-type semiconductor formed by a metal oxide doped with a metal.

In some embodiments, a heterojunction structure is formed between the intrinsic dielectric layer 205 and the substrate 200, and the intrinsic dielectric layer 205 may have a good passivation effect on the surface of the substrate 200, so that recombination of carriers can be greatly avoided, and a relatively long lifetime of the minority carrier and a relatively high open-circuit voltage are realized.

In some embodiments, a material of the intrinsic dielectric layer 205 includes intrinsic amorphous silicon, intrinsic microcrystalline silicon, intrinsic silicon oxide, intrinsic nanocrystalline silicon, or intrinsic silicon carbide. An optional range of a thickness of the intrinsic dielectric layer 205 is greater than or equal to 2 microns as well as less than or equal to 10 microns, preferably 5 microns. In some cases, due to the influence of diffusion other films prepared subsequently or doping process conditions, the intrinsic dielectric layer 205 may also include a small number of doping elements, but the intrinsic dielectric layer with a small number of doping elements is still considered as a dielectric layer of an intrinsic type.

In some embodiments, a thickness of the doped amorphous silicon layer 206 is in a range of 4 nm to 30 nm. For example, the thickness of the doped amorphous silicon layer 206 is in a range of 4 nm to 7.2 nm, 7.2 nm to 13 nm, 13 nm to 16.1 nm, 16.1 nm to 21 nm, 21 nm to 25 nm, or 25 nm to 30 nm.

In some embodiments, a material of the doped semiconductor layer 221 includes polysilicon, monocrystalline silicon, nanocrystalline silicon, amorphous silicon, or microcrystalline silicon.

In some embodiments, a thickness of the doped semiconductor layer 221 is in a range of 10 nm to 200 nm, for example, the thickness of the doped semiconductor layer 221 is in a range of 10 nm to 25 nm, 25 nm to 53 nm, 53 nm to 100 nm, 100 nm to 121 nm, 121 nm to 161 nm, or 161 nm to 200 nm. Within any of the above ranges, the thickness of the doped semiconductor layer 221 is relatively moderate. The doped semiconductor layer 221 may cover a surface of the substrate 200 or a surface of a film layer and may cover part of the morphology of substrate 200 as well as modify the roughness of the substrate 200, so that the doped semiconductor layer 221 has a certain passivation effect, thereby reducing surface defects of the substrate 200. With the thickness of the doped semiconductor layer 221 in the above ranges, the adhesive force and the bonding force between the doped semiconductor layer 221 and the passivation film 222 are also improved so as to improve quality of the passivation film 222.

In some embodiments, within the above ranges, the thickness of the doped semiconductor layer 221 is relatively small, recesses may exist between silicon grains 2213 forming the doped semiconductor layer 221, and the size of the recess 2210 and the number of the recesses 2210 may be controlled by regulating and controlling the thickness of the doped semiconductor layer 221.

In some embodiments, FIG. 7B is an optical microscope image of a surface of the passivation film 222, and it is seen from FIG. 7B that there is no stress point on the surface of the passivation film 222, so that it can be explained that a surface of the doped semiconductor layer 221 facing away from the substrate 200 has recesses 2210, and the recesses 2210 can buffer the deformation difference caused by the difference between thermal expansion coefficients of the doped semiconductor layer 221 and the passivation film 222, so as to buffer the stress of the passivation film 222, thereby reducing a defect rate of the passivation film 222. The doped semiconductor layer 221 has recesses 2210, so that grains constituting the passivation film 222 may migrate in a nucleation process, and gather and grow in the recesses 2210 or near the recesses 2210, so that the difficulty of network-like development after the island shape is increased, agglomeration continues so as to form more coarse grain agglomeration, thereby reducing the area of the grain boundary between grains forming the passivation film 222 and reducing the stress. The doped semiconductor layer 221 has recesses 2210, so that roughness of the doped semiconductor layer 221 is correspondingly increased, a specific surface area of the doped semiconductor layer 221 is increased, surface energy of a surface of the substrate 200 is increased, nucleation density of the passivation film 222 on a heterogeneous doped semiconductor layer 221 is improved, and meanwhile, the adhesion between the passivation film 222 and the doped semiconductor layer 221 is enhanced.

In addition, the doped semiconductor layer 221 has the recesses 2210, and a size of each recess 2210 is smaller than a size of any one of the protrusion structures 201, so that the doped semiconductor layer 221 does not have large defects or generates holes to make the passivation film 222 be in close contact with the doped semiconductor layer 221, thereby improving the adhesion and bonding force between the doped semiconductor layer 221 and the passivation film 222.

The recesses 2210 enhance the internal reflection of the incident light, thereby reducing the optical loss of the cell. At least one portion of the electrode 224 is formed in at least one of the recesses, so that the design of the recesses 2210 enhances the contact area between the electrode paste and the doped semiconductor layer 221, thereby improving the contact performance between the doped semiconductor layer 221 and the electrode 224.

In some embodiments, referring to FIG. 7A, the recesses 2210 have orthographic projections on one of the first surface 21 and the second surface 22, and the orthographic projections has a first area. The surface of the doped semiconductor layer 221 facing away from the substrate 200 has an orthographic projection on one of the first surface 21 and the second surface 22, and the orthographic projection has a second area. The first area and the second area has a ratio in a range of 5% to 80%, i.e., the recesses 2210 occupy 5% to 80% of the surface of the doped semiconductor layer 221 facing away from the substrate 200. For example, the ratio may be in a range of 5% to 20%, 20% to 36%, 36% to 50%, 50% to 68%, 68% to 71%, or 71% to 80%. With the area ratio in any above value or any of the above ranges, the doped semiconductor layer 221 does not have more defects while ensuring that the doped semiconductor layer 221 has more recesses 2210 to reduce the stress of the passivation film 222 and improve the contact performance between the doped semiconductor layer 221 and the electrode. In addition, when the area ratio is within the above ranges, hole problems caused by the passivation film 222 being unable to fill all the recesses 2210 can be avoided.

In some embodiments, referring to FIG. 7A, a size of each recess 2210 includes a one-dimensional size d of an orthographic projection of the recess on a surface of the doped semiconductor layer 221 facing the substrate 200, and the one-dimensional size d is in a range of 5 nm to 100 nm. For example, the one-dimensional size d may be in a range of 5 nm to 18 nm, 18 nm to 32 nm, 32 nm to 50 nm, 50 nm to 73 nm, 73 nm to 86 nm, or 86 nm to 100 nm.

In some embodiments, the recess 2210 has a depth in a range of 5 nm to 100 nm. The depth of the recess 2210 may be in a range of 5 nm to 21 nm, 21 nm to 44 nm, 44 nm to 58 nm, 58 nm to 69 nm, 69 nm to 84 nm, or 84 nm to 100 nm.

With the one-dimensional size d in any of the above ranges and the depth of the recess 2210 in any one of the above ranges, the size of the recess 2210 may be controlled, so as to ensure that the recess 2210 is used to reduce the stress of the passivation film 222 and the film layer performance of the doped semiconductor layer 221 is better.

It should be noted that the recesses 2210 does not penetrate the doped semiconductor layer 221, the passivation film 222 may fully fill the recesses 2210, the passivation film 222 may also cover the recesses 2210 in shape, and the thickness of the passivation film 222 is less than the depth of the recess 2210.

The one-dimensional size d of the recess 2210 refers to that a diameter of a top surface pattern of the recess 2210 (i.e., the orthographic projection of the recess 2210 on the surface of the doped semiconductor layer 221 facing the substrate 200), a distance between two side edges of the top surface pattern, or a distance between two opposite corners of the top surface pattern. The depth of the recess 2210 is a vertical distance between a bottom and a top of the recess 2210.

With continued reference to FIG. 7A, the doped semiconductor layer 221 includes a plurality of silicon grains 2213.

It should be noted that in the process of forming the doped semiconductor layer 221, silicon atoms are arranged in the form of a diamond lattice to form a plurality of crystal nucleuses, the crystal nucleuses grow into grains having crystal planes with different orientations, and the grains are combined to crystallize into polysilicon. The silicon grains 2213 refer to grains having crystal planes with different orientations which constitute the doped semiconductor layer 221.

In some embodiments, a grain size of the silicon grain 2213 is in a range of 100 nm to 900 nm. For example, the grain size of the silicon grain 2213 is in a range of 100 nm to 250 nm, 250 nm to 360 nm, 360 nm to 490 nm, 490 nm to 584 nm, 584 nm to 610 nm, 610 nm to 790 nm, or 790 nm to 900 nm. When grain size of the silicon grain 2213 is in any of the above ranges, a grain boundary between a silicon grain 2213 and a silicon grain 2213 is small, and carriers can easily pass through the doped semiconductor layer 221, thereby improving the carrier migration rate and facilitating the improvement of the cell efficiency.

A size of a grain is referred to as the grain size. Conventional representations include a number of grains per volume (ZV), a number of grains per unit area (ZS), or a length of an average line (or diameter) of the grain. The length of the average line of the grain refers to a length of a line of an extension surface in an extension direction of the grain. The grain size in this embodiment of the present disclosure may be the length of the average line of the grain.

In some embodiments, the silicon grain 2213 has a sheet shape or a block shape. A micrograph of the silicon grain 2213 shown in FIG. 7A has the sheet shape.

It should be noted that the shape of the silicon grain 2213 is observed by an electrical microscope or an optical microscope, etc., with magnification, and the electrical microscope may include a scanning electron microscope (SEM) or an atomic force microscope (AFM) of conventional testing means. FIG. 7A is a micrograph of a silicon grain shown by the scanning electrical microscope, and it is seen that the silicon grain has a sheet shape extending in two dimensions.

In some embodiments, a junction of a silicon grain 2213 and another silicon grain 2213 has recesses 2210. In this way, the recesses 2210 are located at the junction of the silicon grain and the silicon grain, i.e., at the grain boundary 2214, which compared with a conventional solution, increases the space between a grain boundary 2214 and another grain boundary 2214, and the doping element in the doped semiconductor layer 221 can be migrated through the space between the grain boundary and the grain boundary and finally collected by the electrode.

In some embodiments, the passivation film 222 may be a single-layer structure or a laminated structure, and a material of the passivation film 222 includes at least one of silicon oxide, silicon nitride, silicon oxynitride, silicon carbonitride oxide, titanium oxide, hafnium oxide, or aluminum oxide, etc. The passivation film 222 shown in FIG. 7B is an optical microscope image of a surface of silicon nitride.

In some embodiments, the passivation layer 211 may be a single-layer structure or a laminated structure, and a material of the passivation layer 211 includes at least one of silicon oxide, silicon nitride, silicon oxynitride, silicon carbonitride oxide, titanium oxide, hafnium oxide, or aluminum oxide, etc.

In some embodiments, the passivation film 222 and the passivation layer 211 have the same material, and the passivation film 222 and the passivation layer 211 may be prepared in the same process.

In some embodiments, a distance between two adjacent electrodes 224 in a first direction X is in a range of 0.5 mm to 2 mm, for example, may be in a range of 0.5 mm to 0.8 mm, 0.8 mm to 1.15 mm, 1.15 mm to 1.28 mm, 1.28 mm to 1.46 mm, 1.46 mm to 1.68 mm, 1.68 mm to 1.84 mm, or 1.84 mm to 2 mm.

In some embodiments, a width of the electrode 224 in the first direction X is in a range of 5 μm to 50 μm, for example, may be in a range of 5 μm to 9 μm, 9 μm to 14 μm, 14 μm to 23 μm, 23 μm to 34 μm, 34 μm to 42 μm, 42 μm to 45 μm, 45 μm to 48 μm, or 48 μm to 50 μm.

In some embodiments, the electrode 224 is sintered from burn-through paste. A method for forming the electrode 224 includes printing metal paste on a portion of a surface of the passivation film 222 by using a screen-printing process. The metal paste includes at least one of silver, aluminum, copper, tin, gold, lead, or nickel. Then, a sintering process is performed on the metal paste, and the metal paste has a material of a highly corrosive component such as glass powder, so that the corrosive component corrodes the passivation film 222 in the sintering process, thereby the metal paste permeates in the passivation film 222 so as to be in electrical contact with the doped semiconductor layer.

In some embodiments, an orthographic projection of each finger 214 on the second surface 22 overlaps an orthographic projection of a respective electrode 224 on the second surface 22, the electrode 224 and the fingers 214 overlap with each other in a direction perpendicular to the second surface 22 of the substrate 200, and a distance between two adjacent fingers 214 in the first direction X is in a range of 0.5 mm to 2 mm. A width of the finger 214 in the first direction X is in a range of 5 μm to 50 μm.

In some embodiments, the finger 214 is sintered from burn-through paste. A method for forming the finger 214 includes printing metal paste on a portion of a surface of the passivation film 211 by using a screen-printing process. The metal paste includes at least one of silver, aluminum, copper, tin, gold, lead, or nickel. Then, a sintering process is performed on the metal paste, and the metal paste has a material of a highly corrosive component such as glass powder, so that the corrosive component corrodes the passivation film 211 in the sintering process, thereby the metal paste permeates in the passivation film 211 so as to be in electrical contact with the first doped layer 203.

In some embodiments, the finger 214 and the electrode 224 have the same martial, and the finger 214 and the electrode 224 may be prepared in the same process.

In some embodiments, the first surface 21 is a surface having a concave-convex structure, which improves the utilization of light by the solar cell by increasing the internal reflection of the incident light, thereby improving the photoelectric conversion efficiency of the solar cell.

In some embodiments, the textured structure 23 includes a plurality of protrusion structures 101, which may have pyramid shapes, parabola shapes, or elliptic sphere shapes.

Correspondingly, in the solar cell shown in FIG. 3 to FIG. 7, the first surface is the front surface, the second surface is the rear surface, and the doped semiconductor layer is formed over the second surface. Embodiments of the present disclosure further provide a solar cell in which the first surface of the solar cell is the front surface, the second surface is the rear surface, and the doped semiconductor layer is formed over the first surface, technical features that are the same as or corresponding to those in the above embodiments are not repeated herein.

Figure 9:
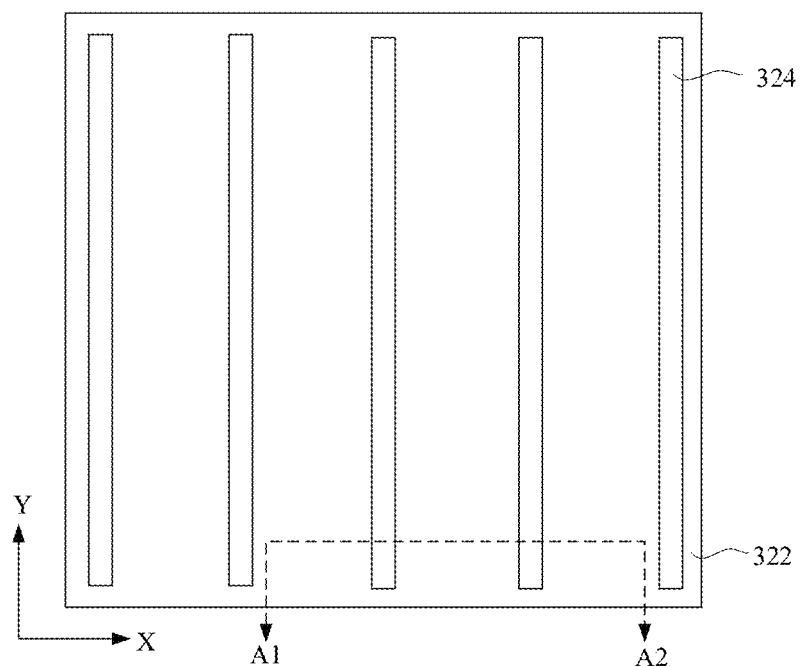
FIG. 9 is a schematic structural diagram of a second solar cell according to an embodiment of the present disclosure.
Figure 10:
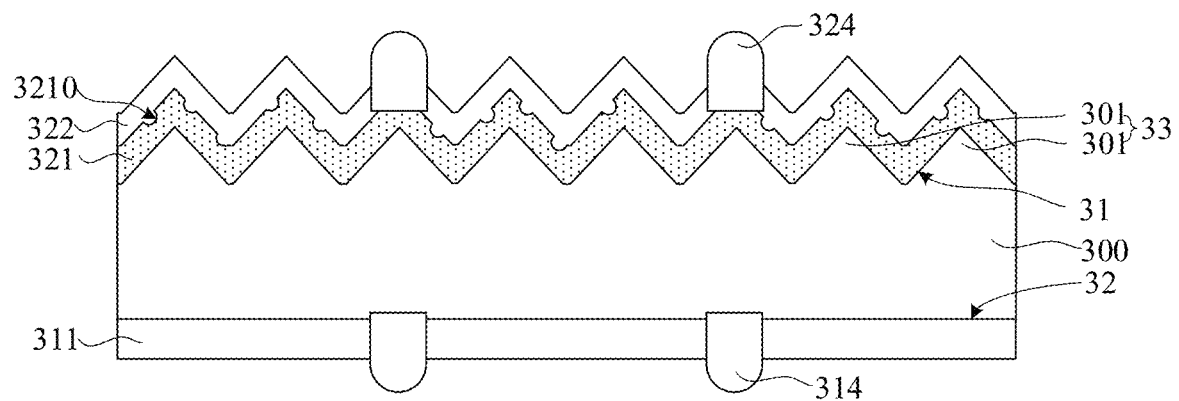
FIG. 10 is a first cross-sectional view of FIG. 9 taken along line A1-A2.
Figure 11:
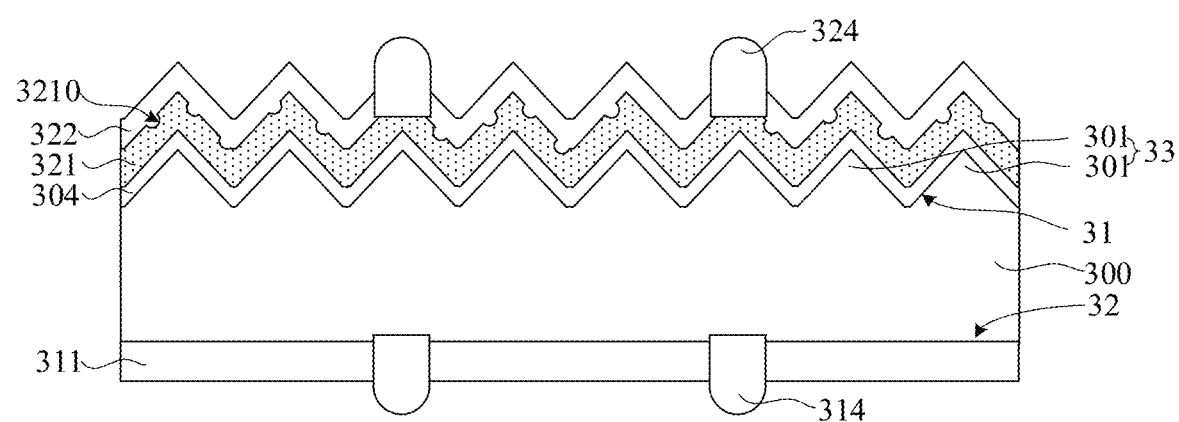
FIG. 11 is a second cross-sectional view of FIG. 9 taken along line A1-A2.
Figure 12:
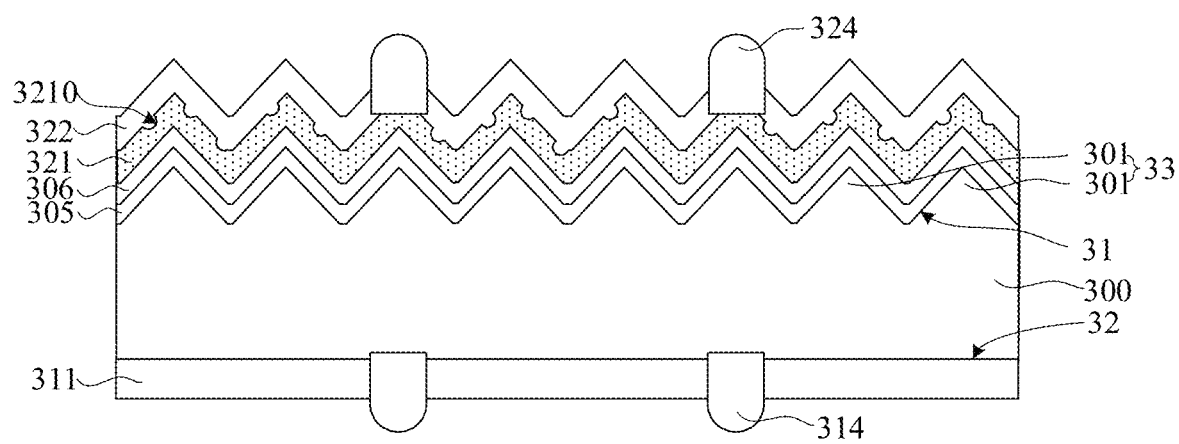
FIG. 12 is a third cross-sectional view of FIG. 9 taken along line A1-A2.

FIG. 9 is a schematic structural diagram of a second solar cell according to an embodiment of the present disclosure. FIG. 10 is a first cross-sectional view of FIG. 9 taken along line A1-A2. FIG. 11 is a second cross-sectional view of FIG. 9 taken along line A1-A2. FIG. 12 is a third cross-sectional view of FIG. 9 taken along line A1-A2.

Referring to FIG. 10, the solar cell includes a substrate 300 having a first surface 31 and a second surface 32 disposed opposite to each other, the first surface 31 has a textured structure 33, and the textured structure 33 includes protrusion structures 301. The solar cell further includes a doped semiconductor layer 321 formed over the first surface 31, a passivation film 322 formed on the doped semiconductor layer 321, and electrodes 324 penetrating the passivation film 322 to be in electrical contact with the doped semiconductor layer 321. A surface of the doped semiconductor layer 321 facing away from the substrate 300 is provided with a plurality of recesses 3210, and a size of each recess 3210 is smaller than a size of any of the protrusion structures 301. The passivation film 322 has at least one portion formed in at least one of the recesses 3210, and each electrode 324 has a portion further formed in some of the recesses 3210.

In some embodiments, the doped semiconductor layer 321 covers the textured structure 33, and the solar cell further includes a passivation layer 311 formed on the second surface 32 of the substrate and fingers 314 penetrating the passivation layer 311 to be in electrical contact with the second surface 32 of the substrate 300.

In some embodiments, a material of the doped semiconductor layer 311 is the same as a material of the substrate 300, and the material of the doped semiconductor layer 311 includes crystalline silicon.

In some embodiments, the substrate is an N-type substrate, the doped semiconductor layer is doped with a P-type doping element, the first doped layer is doped with an N-type doping element, and a PN junction is formed between the substrate and the doped semiconductor layer.

Referring to FIG. 11, the solar cell further includes a tunneling dielectric layer 304 formed between the substrate 300 and the doped semiconductor layer 321, the doped semiconductor layer 321 is doped with one of the N-type doping element and the P-type doping element, and the substrate 300 is doped with the other of the N-type doping element and the P-type doping element. In this way, a PN junction is constructed between the doped semiconductor layer 321 and the substrate 300, and new hole-electron pairs are formed by irradiating the PN junction with the sun. The photo-generated holes flow to the P-type region under the action of a built-in electric field of the P-N junction, the photo-generated electrons flow to the N-type region, and a current is generated after the circuit is turned on. The doped semiconductor layer 321 may be a doped polysilicon layer. A passivation contact structure is formed between the tunneling dielectric layer 304 and the doped polysilicon layer.

Related descriptions of the doped semiconductor layer 321 and the tunneling dielectric layer 304 can be referred to descriptions of the tunneling dielectric layer 204 and the doped semiconductor layer 221 in FIG. 5.

Referring to FIG. 12, the solar cell further includes an intrinsic dielectric layer 305 and a doped amorphous silicon layer 306 formed between the doped semiconductor layer 321 and the first surface 31. The intrinsic dielectric layer 305 is formed on the first surface 31, and the doped amorphous silicon layer 306 is formed on the intrinsic dielectric layer 305. The doped semiconductor layer 321 is a transparent conductive layer, and a material of the transparent conductive layer includes at least one of indium tin oxide (ITO), aluminum-doped zinc oxide (AZO), cerium-doped indium oxide, and tungsten-doped indium oxide.

Related descriptions of the doped semiconductor layer 321, the intrinsic dielectric layer 305, and the doped amorphous silicon layer 306 can be referred to descriptions of the doped semiconductor layer 221, the intrinsic dielectric layer 205, and the doped amorphous silicon layer 206 in FIG. 6.

In some embodiments, the doped amorphous silicon layer and the substrate are doped with doping elements of different conductive types, and a PN junction is formed between the doped amorphous silicon layer and the substrate. The intrinsic dielectric layer is inserted between the PN junction as a buffer layer, and the intrinsic dielectric layer has a good passivation effect on the surface of the substrate 300, so that recombination of carriers is greatly avoided, and relatively high lifetime of minority carriers and relatively large open-circuit voltage are realized.

Related descriptions of the substrate 300, the passivation layer 311, the fingers 314, the tunneling dielectric layer 304, the intrinsic dielectric layer 305, the doped amorphous silicon layer 306, the electrodes 324, the textured structure 33, the doped semiconductor layer 321, the passivation film 322, and the recesses 3210 in FIG. 10 to FIG. 12 can be referred to descriptions of the substrate 200, the passivation layer 211, the fingers 214, the tunneling dielectric layer 204, the intrinsic dielectric layer 205, the intrinsic amorphous silicon layer 206, the electrodes 224, the textured structure 23, the doped semiconductor layer 221, the passivation film 222, and the recesses 2210 in FIG. 3 to FIG. 6, which are not repeated herein.

Some embodiments of the present disclosure further provide a solar cell, the doped semiconductor layer includes a first doped conductive film and a second doped conductive film, the first doped conductive film is formed over the textured structure, and the second doped conductive film is formed over the second surface. At least one of the first doped conductive film and the second doped conductive film has recesses, and technical features thereof that are the same as or corresponding to those in the above embodiments are not repeated herein.

Figure 13:
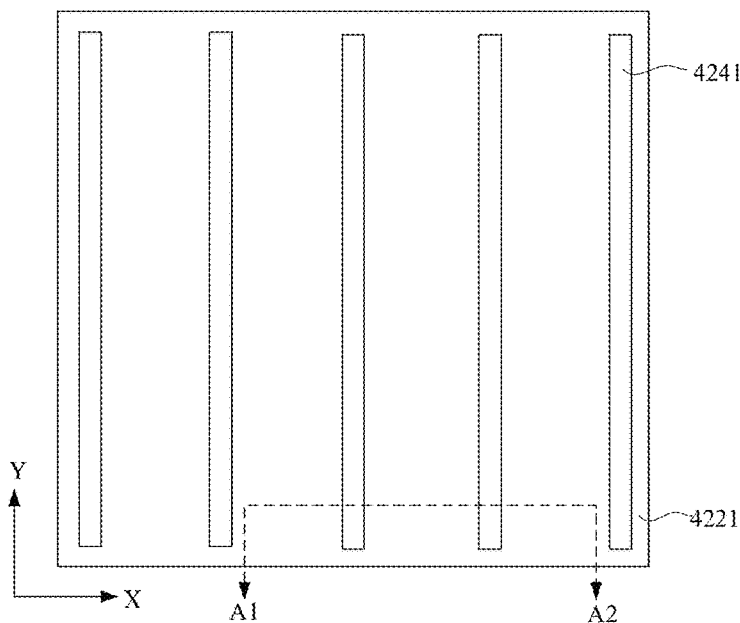
FIG. 13 is a schematic structural diagram of a third solar cell according to an embodiment of the present disclosure.
Figure 14:
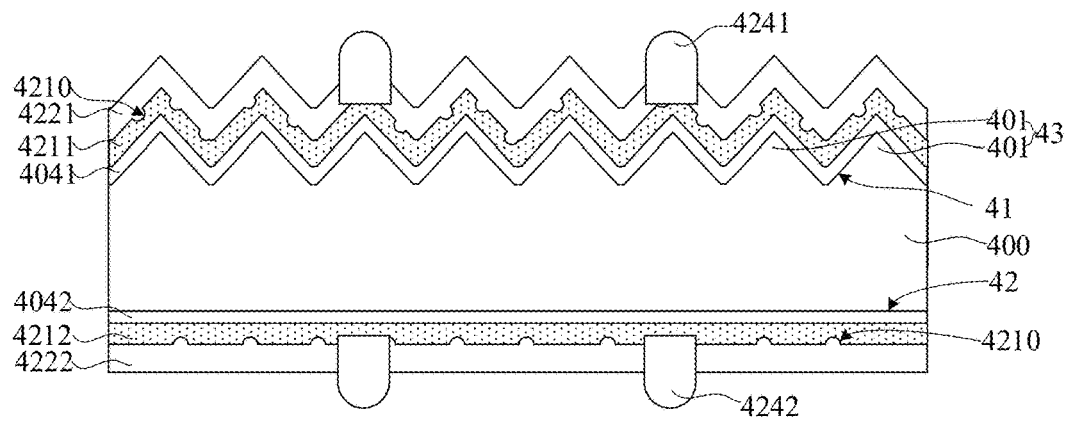
FIG. 14 is a first cross-sectional view of FIG. 13 taken along line A1-A2.
Figure 15:
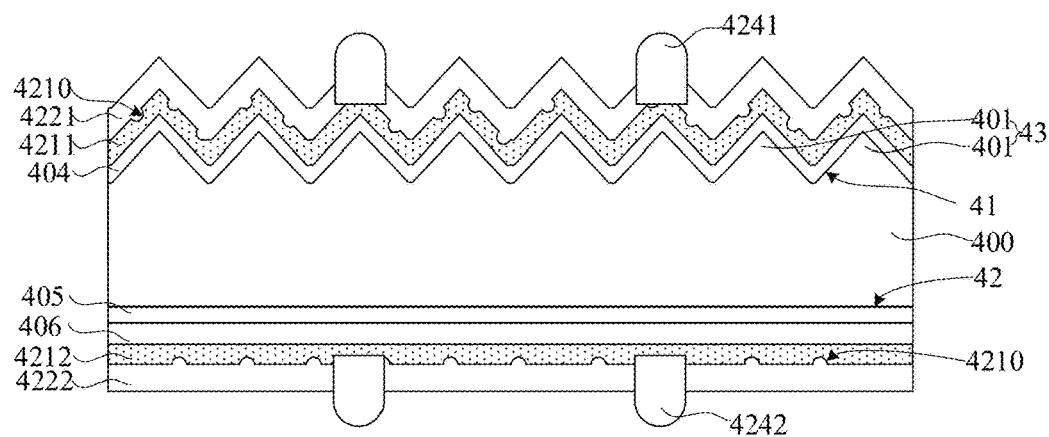
FIG. 15 is a second cross-sectional view of FIG. 13 taken along line A1-A2.

FIG. 13 is a schematic structural diagram of a third solar cell according to an embodiment of the present disclosure. FIG. 14 is a first cross-sectional view of FIG. 13 taken along a line A1-A2. FIG. 15 is a second cross-sectional view of FIG. 13 taken along line A1-A2.

Referring to FIG. 14, the solar cell includes a substrate 400 having a first surface 41 and a second surface 42 disposed opposite to each other, the first surface 41 has a textured structure 43, and the textured structure 43 includes protrusion structures 401. The solar cell further includes a first doped conductive film 4211 formed over the textured structure 43, a second doped conductive film 4212 formed over the second surface 42, a first passivation film 4221 formed on the first doped conductive film 4211, a second passivation film 4222 formed on the second doped conductive film 4212, first electrodes 4241 penetrating the first passivation film 4221 to be in electrical contact with the first doped conductive film 4211, and second electrodes 4242 penetrating the second passivation film 4222 to be in electrical contact with the second doped conductive film 4212. A surface of each of at least one of the first doped conductive film 4211 and the second doped conductive film 4212 facing away from the substrate 400 has recesses 4210 (FIG. 14 only shows a case where surfaces of both the first doped conductive film 4211 and the second doped conductive film 4212 facing away from the substrate 400 have recesses 4210), and a size of each recess is smaller than any of the protrusion structures 401. Each of at least one of the first passivation film 4221 and the second passivation film 4222 has at least one portion formed in at least one of the recesses 4210 (FIG. 14 only shows a case where both the first passivation film 4221 and the second passivation film 4222 have at least one portion formed in at least one of the recesses 4210). Each of at least one of the first electrode 4241 and the second electrode 4242 has at least one portion formed in at least one of the recesses 4210.

In some embodiments, the first doped conductive film 4211 is doped with one of an N-type doping element and a P-type doping element, and the second doped conductive film 4212 is doped with the other of the N-type doping element and the P-type doping element.

In some embodiments, the solar cell further includes a first dielectric layer 4041 formed between the second doped conductive film 4212 and the second surface 42 and a second dielectric layer 4042 formed between the first doped conductive film 4211 and the substrate 200.

In some embodiments, at least one of the first dielectric layer 4041 and the second dielectric layer 4042 has a material including silicon oxide, amorphous silicon, microcrystalline silicon, nanocrystalline silicon, or silicon carbide.

In some embodiments, the first dielectric layer 4041 and the second dielectric layer 4042 may be tunneling dielectric layers, the first dielectric layer 4041 may refer to the tunneling dielectric layer 304 in FIG. 11, the second dielectric layer 4042 may refer to the tunneling dielectric layer 204 in FIG. 5. Similarly, the first doped conductive film 4211 may refer to the doped semiconductor layer 321 in FIG. 11, and the second doped conductive film 4212 may refer to the doped semiconductor layer 221 in FIG. 5.

In some embodiments, the electrodes include the first electrodes 4241 and the second electrodes 4242, the first electrodes 4241 may refer to the electrodes 324 in FIG. 11, the second electrodes 4242 may refer to the electrodes 224 in FIG. 5. The first passivation film 4221 may refer to the passivation film 322 in FIG. 11, and the second passivation film 4222 may refer to the passivation film 222 in FIG. 5.

In some embodiments, a thickness of the first doped conductive film 4211 is less than or equal to a thickness of the second doped conductive film 4212. In this way, an average thickness of the first doped conductive film 4211 formed over the front surface is relatively small, which reduces parasitic absorption of the first doped conductive film 4211 to the incident light irradiated onto the front surface, and an average thickness of the second doped conductive film 4212 formed over the rear surface is relatively large, which reduces the risk of the P-type doping element diffusing into the substrate caused by the second electrode burning through the second doped conductive film 4212 due to an excessively thin second doped conductive film 4212, so that the problem that the P-type doping element in the second doped conductive film 4212 is accumulated at the interface of the substrate to form a 'dead layer' is avoided, the carrier transport efficiency is improved, and the generation of the carrier recombination center is reduced.

In some embodiments, a material of the first doped conductive film 4211 is different from a material of the second doped conductive film 4212. For example, the first doped conductive film 4211 is a doped polysilicon layer, and the second doped conductive film 4212 is a transparent conductive layer. For another example, the first doped conductive film 4211 is a film layer made of the same material as the substrate, and the second doped conductive film 4212 is a doped polysilicon layer or a transparent conductive layer.

Referring to FIG. 15, the first doped conductive film 4211 is a doped polysilicon layer, the second doped conductive film 4212 is a transparent conductive layer, a tunneling dielectric layer 404 is formed between the first doped conductive film 4211 and the substrate 400, and an intrinsic dielectric layer 405 and a doped amorphous silicon layer 406 are formed between the second doped conductive film 4212 and the substrate 400.

In some embodiments, the second doped conductive film 4212 and the substrate 400 are doped with doping elements having the same conductive type, so the first doped conductive film 4211 and the substrate are doped with doping elements having different conductive types. For example, the substrate is an N-type substrate, the second doped conductive film 4212 is doped with an N-type doping element, and the first doped conductive film 4211 is doped with a P-type doping element, that is, a PN junction is formed between the first doped conductive film 4211 and the substrate.

In some embodiments, the first doped conductive film 4211 and the substrate are doped with the same conductive type of doping elements, so the second doped conductive film 4212 and the substrate are doped with different conductive types of doping elements. For example, the substrate is an N-type substrate, the first doped conductive film 4211 is doped with an N-type doping element, and the second doped conductive film 4212 is doped with a P-type doping element, that is, a PN junction is formed between the second doped conductive film 4212 and the substrate.

Related descriptions of the substrate 400, the tunneling dielectric layer 404, the intrinsic dielectric layer 405, the intrinsic amorphous silicon layer 406, the textured structure 43, the first doped conductive film 4211, the second doped conductive film 4212, the first passivation film 4221, the second passivation film 4222, and the recesses 4210 in FIG. 15 can be referred to related descriptions of the substrate 200, the passivation layer 211, the tunneling dielectric layer 204, the intrinsic dielectric layer 205, the intrinsic amorphous silicon layer 206, the textured structure 23, the doped semiconductor layer 221, the doped semiconductor layer 321, the passivation film 222, the passivation film 322, and the recesses 2210 in FIG. 3 to FIG. 12, which are not repeated herein.

Some embodiments of the present disclosure further provide a solar cell including electrode regions and non-electrode regions, and the doped conductive layer is formed over portions of a surface of the substrate corresponding to the electrode regions.

Figure 16:
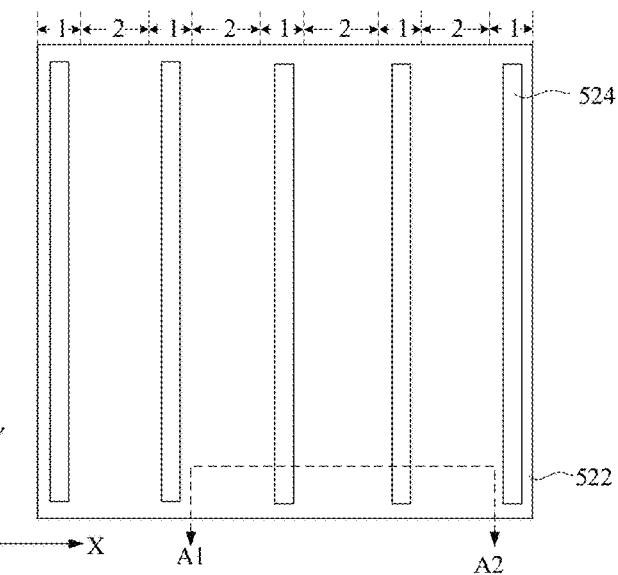
FIG. 16 is a schematic structural diagram of a fourth solar cell according to an embodiment of the present disclosure.
Figure 17:
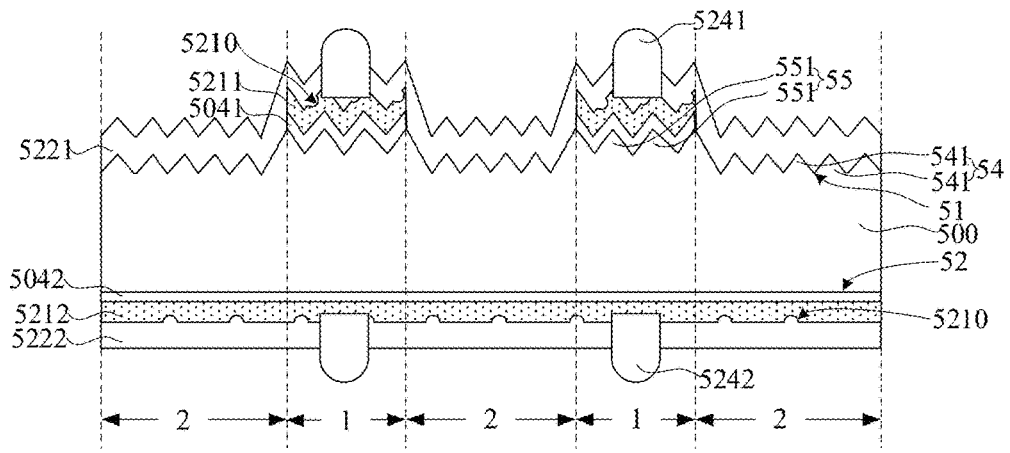
FIG. 17 is a schematic cross-sectional view of FIG. 16 taken along line A1-A2.
Figure 18:
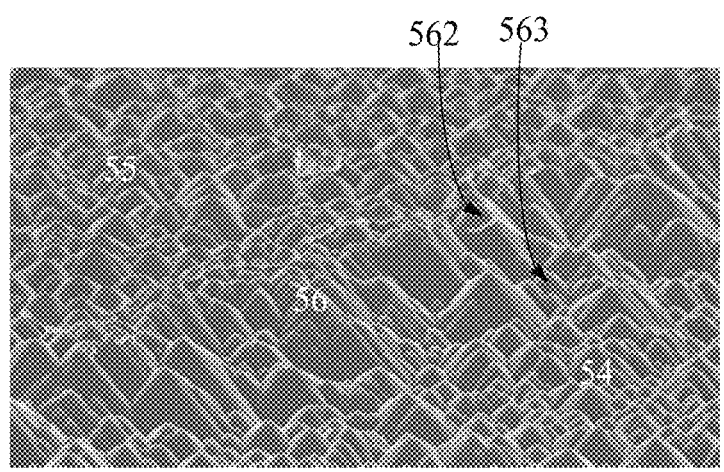
FIG. 18 is an electron micrograph of an electrode region and a non-electrode region in the solar cell as shown in FIG. 16.
Figure 19:
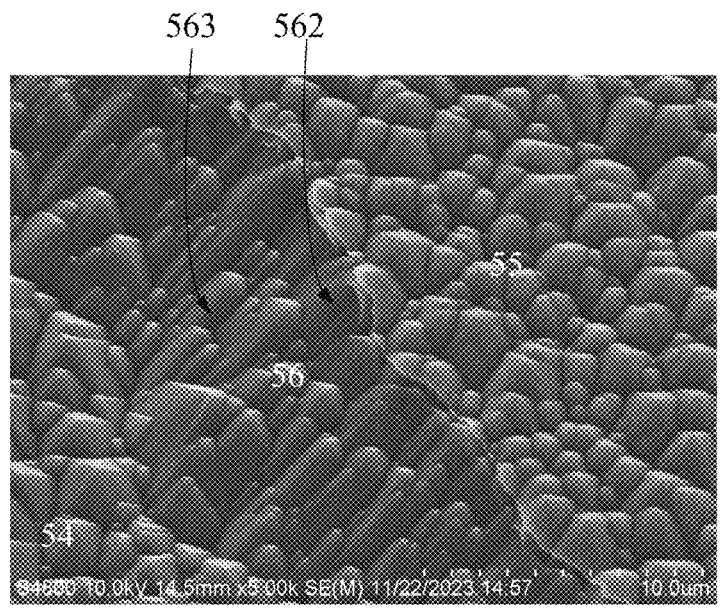
FIG. 19 is another electron micrograph of an electrode region and a non-electrode region in the solar cell as shown in FIG. 16.
Figure 20:
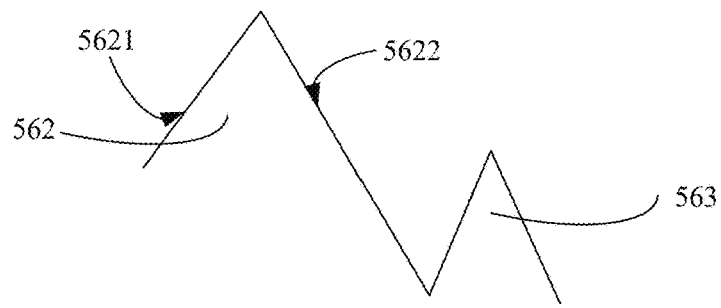
FIG. 20 is a partial schematic structural diagram of a third surface structure in the solar cell as shown in FIG. 16.

FIG. 16 is a schematic structural diagram of a fourth solar cell according to an embodiment of the present disclosure. FIG. 17 is a schematic cross-sectional view of FIG. 16 taken along line A1-A2. FIG. 18 is an electron microscope image of electrode regions and non-electrode regions in the solar cell in FIG. 16. FIG. 19 is another electron microscope image of electrode regions and non-electrode regions in the solar cell in FIG. 16. FIG. 20 is a partial schematic structural diagram of a third surface structure in the solar cell in FIG. 16.

Referring to FIG. 17, the solar cell includes a substrate 500 having a first surface 51 and a second surface 52 disposed opposite to each other, a first doped conductive film 5211 formed over the first surface 51, a second doped conductive film 5212 formed over the second surface 52, a first passivation film 5221 formed on the first doped conductive film 5211 and a portion of the first surface 51, a second passivation film 5222 formed on the second doped conductive film 5212, first electrodes 5241 penetrating the first passivation film 5221 to be in electrical contact with the first doped conductive film 5211, and second electrodes 5242 penetrating the second passivation film 5222 to be in electrical contact with the second doped conductive film 5212. A surface of each of at least one of the first doped conductive film 5211 and the second doped conductive film 5212 facing away from the substrate 500 has recesses 5210 (FIG. 17 only shows a case where surfaces of both the first doped conductive film 5211 and the second doped conductive film 5212 facing away from the substrate 500 have recesses 5210). A size of each recess is smaller than any of the protrusion structures 501. Each of at least one of the first passivation film 5221 and the second passivation film 5222 has at least one portion formed in at least one of the recesses 5210 (FIG. 17 only shows a case where both the first passivation film 5221 and the second passivation film 5222 have at least one portion further formed in at least one of the recesses 5210). Each of at least one of the first electrode 5241 and the second electrode 5242 has at least one portion formed in at least one of the recesses 5210.

Referring to FIG. 16, the solar cell includes electrode regions 1 and non-electrode regions 2 alternatingly arranged, the first doped conductive film 5211 is formed in the electrode regions 1, and both the first doped conductive film 5211 and the second doped conductive film 5212 formed in the electrode regions 1 and the non-electrode regions 2.

In some embodiments, the solar cell further includes a first dielectric layer 5041 formed between the first doped conductive film 5211 and the substrate 500 and a second dielectric layer 5042 formed between the second doped conductive film 5212 and the substrate 500.

In some embodiments, the electrode regions 1 refer to portions of the substrate 500 aligned with electrodes in a thickness direction of the substrate 500, or refer to regions where orthographic projections of the first electrodes 5241 on the substrate 500 are or regions where orthographic projections of the second electrodes 5242 on the substrate 500 are. On the contrary, regions/portions of the substrate 500 not aligned with the first electrodes 5241 and the second electrodes 5242 are the non-electrode regions 2. An area of an electrode region 1 is greater than or equal to an orthographic projection of a first electrode 5241 on the substrate 500 or an orthographic projection of a second electrode 5242 on the substrate 500, thereby ensuring that regions where the first electrodes 5241 or the second electrodes 5242 are in contact are the electrode regions 1.

In some embodiments, a width of an electrode region is 1 to 5 times a width of an electrode. If the width of the electrode region is too large, the integrity and uniformity of films in the non-electrode region 1 may be affected, and the internal reflection of the light is reduced, which is not conducive to improving the recombination rate of the carriers on surface and the photoelectric conversion efficiency of the solar cell. A perpendicular bisector of the electrode region may overlap with a central axis of the electrode or deviate from the central axis of the electrode by 5%.

In some embodiments, referring to FIG. 17, the first surface 11 has first surface structures 55 in the electrode regions 1, the first dielectric layer and the first doped conductive film are formed over the first surface structures 55, the first surface 11 has second surface structures 54 in the non-electrode regions 2, and the first passivation film is further formed on the second surface structures 54.

In some embodiments, a minimum distance between a first surface structure 55 and the second surface 52 is defined as a first distance, a minimum distance between a second surface structure 54 and the second surface 52 is defined as a second distance, and the first distance is less than the second distance.

The minimum distance between the first surface structure and the second surface refers to a distance between a portion of the first surface structure closest to the second surface and the second surface. The minimum distance between the second surface structure and the second surface refers to a distance between a portion of the first surface structure closest to the second surface and the second surface.

In some embodiments, a difference between the first distance and the second distance is in a range of 0.5 μm to 10 μm. For example, the difference between the first distance and the second distance may be in a range of 0.5 μm to 2 μm, 2 μm to 3.8 μm, 3.8 μm to 6.9 μm, 6.9 μm to 7.6 μm, 7.6 μm to 8.3 μm, or 8.3 μm to 10 μm.

In some embodiments, referring to FIG. 17, the first surface structure 55 includes a plurality of first protrusion structures 551 arranged at intervals, and in practical applications, the arrangement manner of the plurality of first protrusion structures 551 is not limited. Since the thickness of the first dielectric layer and the thickness of the first doped conductive film are relatively thin, the first dielectric layer and the first doped conductive film are able to show morphologies of the first protrusion structures 551.

In some embodiments, referring to FIG. 17, the second surface structure 54 includes a plurality of second protrusion structures 541, and in practical applications, the arrangement manner of the plurality of second protrusion structures 541 is not limited.

In some embodiments, at least one of the first surface structure 55 and the second surface structure 54 includes platform protrusion structures or pyramid textured structures.

In some embodiments, referring to FIG. 18 or FIG. 19, the surface of the substrate 500 further has third surface structures 56 each formed at a junction of a non-electrode region 2 and an electrode region 1.

Referring to FIG. 18, each third surface structure 56 has a plurality of third protrusion structures 562 arranged in an intersecting manner, and the third surface structure 56 further includes micro-convex structures 563 in addition to discrete third protrusion structures 562, so that a probability that the incident light to the junction of the electrode region and the non-electrode region at different angles is reflected at least once and absorbed by the substrate 500 through the third protrusion structures 562 and/or the micro-convex structures 563 is increased, and a probability that the incident light is reflected at least once and reflected by the third protrusion structures 562 and/or the micro-convex structures 563 to the non-electrode region 2 so as to be absorbed by the non-electrode region 2 is increased, thereby improving the absorption rate of the first surface 51 to the incident light. By improving the problem of serious recombination of carriers in the electrode region 1 and improving the absorption rate of the first surface 51 to the incident light, the photoelectric conversion efficiency of the solar cell is improved.

In some embodiments, the third surface structure 56 includes prism structures, pyramid structures, or tetrahedral structures.

In some embodiments, referring to FIG. 18 or FIG. 19, the micro-convex structure 563 includes at least one of a prism structure inclined towards the electrode region 1, a second pyramid structure, or a triangular plate-like structure.

It should be noted that, as an example, the micro-convex structure 563 includes the prism structure inclined toward the electrode region 1, the second pyramid structure or the triangular plate-like structure as shown in FIG. 18 or FIG. 19. In practical applications, for the third surface structure 56 in the same region, the micro-convex structure 563 may include only one of the second pyramid structure, the triangular plate-shaped structure, or the prism structure inclined toward the electrode region 1, or any two of the three. In addition, the micro-convex structure 563 may be an irregular granular structure in addition to one of the prism structure inclined toward the electrode region 1, the second pyramid structure, or the triangular plate-shaped structure.

Specific characteristics of the prism structure are described in detail below.

In some embodiments, referring to FIG. 19, the prism structures are located on side surfaces of the third protrusion structures 562. The following two arrangements of the prism structures on the side surfaces of the third protrusion structures 562 are provided. In some cases, one prism structure is located on a side surface of one third protrusion structure 562. In other cases, a plurality of prism structures are attached to the same side surface of one third protrusion structure 562, and each prism structure is in contact and connection with the side surface.

In some embodiments, with continued reference to FIG. 19, some of the prism structures are located at a portion of the junction adjacent to the electrode region 1. For example, the prism structures are located between the third protrusion structures 562 and the electrode region 1.

In some embodiments, the plurality of prism structures are sequentially arranged in a direction away from the side surface of the third protrusion structure 562. For example, only the prism structure closest to the side surface of the third protrusion structure 562 among the plurality of prism structures is in contact and connection with the side surface of the third protrusion structure 562.

It should be noted that the plurality of prism structures at the same junction include at least one of the prism structures described in the above three kind of embodiments, that is, the plurality of prism structures at the same junction may have the characteristics of the prism structures in the above three kind of embodiments, or have the characteristics of the prism structures in any two of the above three kind of embodiments, or have the characteristics of the prism structures in any one of the above three kind of embodiments.

Specific characteristics of the second pyramid structures are described in detail below.

In some embodiments, a bottom of the second pyramid structure is in contact and connection with the bottom of the third protrusion structure 562. In some cases, a periphery of the bottom of one third protrusion structure 562 is surrounded with a plurality of second pyramid structures, and the bottom of each second pyramid structure is in contact and connection with the bottom of the third protrusion structure 562.

In some embodiments, at least one second pyramid structure is located at the interval between two adjacent third protrusion structures 562. In other words, the bottom of the second pyramid structure is not in contact and connection with the bottom of the third protrusion structure 562.

It should be noted that the second pyramid structures at the same junction include the second pyramid structures in at least one of the above two kind of embodiments, that is, the plurality of second pyramid structures at the same junction may have the characteristics of the second pyramid structures in the above two kind of embodiments, or have the characteristics of the second pyramid structures in any one of the above two kind of embodiments.

Specific characteristics of the triangular plate-like structures are described in detail below.

In some embodiments, one triangular plate-like structure is located on a side surface of one third protrusion structure 562 in some cases, and in other cases, a plurality of triangular plate-like structures are attached to the same side surface of one third protrusion structure 562, and each triangular plate-like structure is in contact and connection with the side surface.

In some embodiments, the plurality of triangular plate-like structures are sequentially arranged in a direction away from the side surface of the third protrusion structure 562. For example, only the triangular plate-like structure closest to the side surface of the third protrusion structure 562 among the plurality of triangular plate-like structures is in contact and connection with the side surface of the third protrusion structure 562.

It should be noted that the triangular plate-like structures at the same junction include the triangular plate-like structures in at least one of the above two kind of embodiments, that is, the plurality of triangular plate-like structures at the same junction may have the characteristics of the triangular plate-like structures in the above two kind of embodiments, or have the characteristics of the triangular plate-like structures in any one of the above two kind of embodiments.

In some embodiments, the third protrusion structure 562 is located at a portion of the junction adjacent to the non-electrode region 2. In other words, there are more typical third protrusion structures 562 at the portion of the junction adjacent to the non-electrode region 2.

It should be noted that, the third surface structures 56 at the junction are described in various embodiments, i.e., the structure of the third surface structure 56 has diversity. In some cases, the plurality of micro-convex structures 563 are also provided at the same junction at which the third protrusion structures 562 are provided, and the specific characteristics of the plurality of micro-convex structures 563 at different junctions may be different. For example, one of two adjacent junctions has the prism structures inclined toward the electrode region 1 and the second pyramid structures, and the other has the second pyramid structures and the triangular plate-like structures.

Referring to FIG. 20, the third protrusion structure 562 includes a first side surface 5621 and a second side surface 5622, the first side surface 5621 faces the electrode region 1, the dielectric layer 504 covers the first side surface 5621, the second side surface 5622 faces the non-electrode region 2, and a radial length of the first side surface 5621 is less than a radial length of the second side surface 5622.

In some embodiments, related descriptions of the substrate 500, the first dielectric layer 5041, the second dielectric layer 5042, the first doped conductive film 5211, the second doped conductive film 5212, the first passivation film 5221, the second passivation film 5222, the first electrodes 5241, the second electrodes 5242, and the recesses 5210 in FIG. 17 may refer to related descriptions of the substrate 400, the first dielectric layer 4041, the second dielectric layer 4042, the first doped conductive film 4211, the second doped conductive film 4212, the first passivation film 4221, the second passivation film 4222, the first electrodes 4241, the second electrodes 4242, and the recesses 4210 in FIG. 15, which are not repeated herein.

Some embodiments of the present disclosure further provide a solar cell in which the doped semiconductor layer includes a first doped conductive film and a second doped conductive film, and the first doped conductive film and the second doped conductive film are alternately formed over the second surface, technical features thereof that are the same as or corresponding to those in the above embodiments are not repeated herein.

Figure 21:
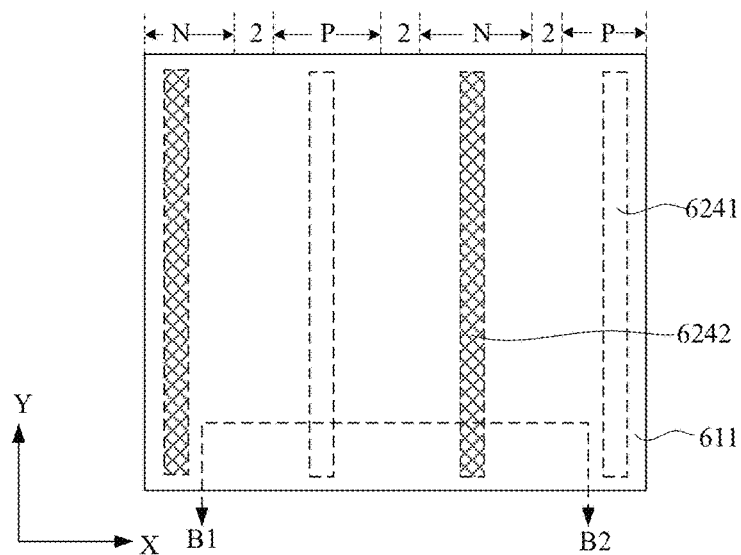
FIG. 21 is a schematic structural diagram of a fifth solar cell according to an embodiment of the present disclosure.
Figure 22:
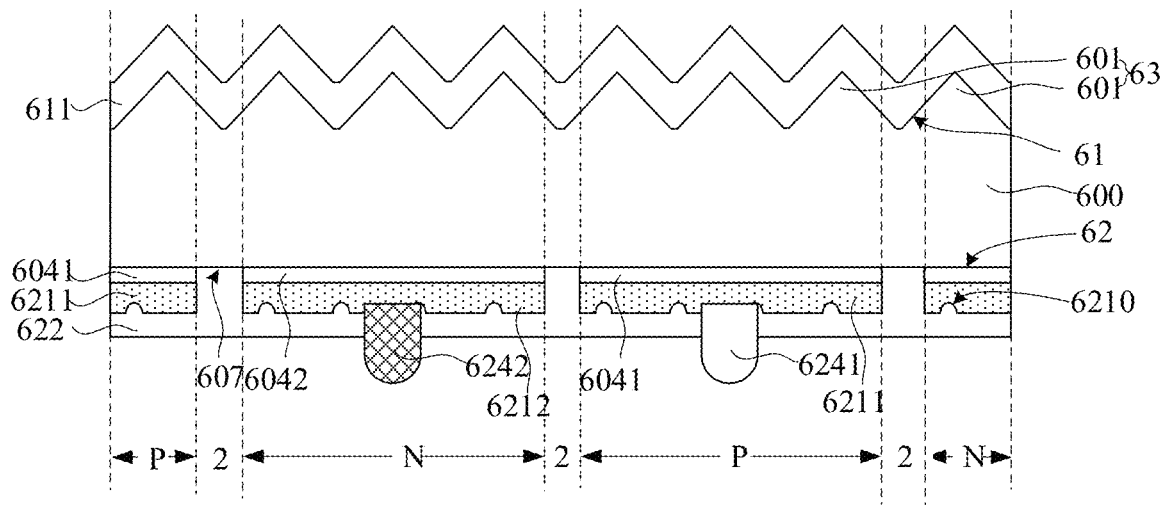
FIG. 22 is a schematic cross-sectional view of FIG. 21 taken along line B1-B2.

FIG. 21 is a schematic structural diagram of a fifth solar cell according to an embodiment of the present disclosure. FIG. 22 is a schematic cross-sectional view of FIG. 21 taken along line B1-B2.

Referring to FIG. 22, the solar cell includes a substrate 600 having a first surface 61 and a second surface 62 disposed opposite to each other, the first surface 61 has a textured structure 63, and the textured structure 63 includes protrusion structures 601. The solar cell further includes first doped conductive films 6211 and second doped conductive films 6212 alternatingly formed over the second surface 62, a passivation film 622 formed on the first doped conductive films 6211 and the second doped conductive films 6212, first electrodes 6241 each penetrating the passivation film 622 to be in electrical contact with a respective first doped conductive film 6211, and second electrodes 6242 each penetrating the passivation film 622 to be in electrical contact with a respective second doped conductive film 6212. A surface of each of the first doped conductive films 6211 and the second doped conductive films 6212 facing away from the substrate 600 has recesses 6210, and a size of each recess 6210 is smaller than any of the protrusion structures 601. The passivation film 622 has at least one portion formed in at least one of the recesses 6210, and each of the electrodes has at least one portion formed in at least one of the recesses 6210.

In some embodiments, at least one of the first doped conductive film 6211 and the second doped conductive film 6212 has recesses.

In some embodiments, the substrate 100 has P-type regions and N-type regions spaced apart and alternatingly arranged.

In some embodiments, the first surface of the substrate has a front surface field (FSF), a conductivity type of doped ions in the front surface field is the same as a conductivity type of doped ions in the substrate, which utilizes the field passivation effect to reduce concentration of minority carriers on the surface, thereby reducing the surface recombination rate, reducing the series resistance, and improving the electronic transmission capability.

In some embodiments, there is a non-electrode region 2 between a P-type region and an N-type region adjacent to each other, the passivation layer is formed in the non-electrode region 2. A trench 607 is formed between the P-type region and the N-type region adjacent to each other, so as to achieve automatic isolation between regions of different conductive types, which avoids heavily doped P-type regions and N-type regions of the rear surface of the IBC cell from forming tunnel junctions to cause electric leakage to affect the cell efficiency.

In some embodiments, the solar cell includes a first dielectric layer 6041 and a first doped conductive film 6211 that are stacked. The first dielectric layer 6041 is formed on the rear surface, the first doped conductive film 6211 is formed on the first dielectric layer 6041, and the first doped conductive film 6211 is doped with an N-type doping element. The first dielectric layer 6041 and the first doped conductive film 6211 are formed on the surface of the substrate 600 in the N-type regions.

In some embodiments, the solar cell includes a second dielectric layer 6042 and a second doped conductive film 6212 that are stacked. The second dielectric layer 6042 is formed on the rear surface, the second doped conductive film 6212 is formed on the second dielectric layer 6042, and the second doped conductive film 6212 is doped with a P-type doping element. The second dielectric layer 6042 and the second doped conductive film 6212 are formed on the surface of the substrate 600 in the P-type regions.

For the solar cell shown in FIG. 22, in some embodiments, the first doped conductive film 6211 and the substrate are doped with doping elements of different conductivity types, a PN junction is formed between the first doped conductive film 6211 and the substrate, and the first doped conductive film 6211 serves as an emitter. In some embodiments, the second doped conductive film 6212 and the substrate are doped with doping elements of different conductivity types, a PN junction is formed between the second doped conductive film 6212 and the substrate, and the second doped conductive film 6212 serves as the emitter.

Some embodiments of the present disclosure further provide a method for preparing a solar cell, which may be used to prepare the solar cell provided in the foregoing embodiments, and technical features the same as or corresponding to the technical features in the above embodiments are not repeated herein.

The method for preparing the solar cell shown in FIG. 5 is taken as an example.

The method includes providing a substrate having a first surface and a second surface disposed opposite to each other. The first surface has a textured structure, and the textured structure includes protrusion structures.

Specifically, the method includes providing an original substrate and polishing two opposite side surfaces of the original substrate. The polishing treatment is used to reduce surface defects of the substrate.

In some embodiments, the substrate has electrode regions and non-electrode regions which are alternatingly arranged.

The method includes performing texturing treatment on one of the two opposite surfaces of the substrate, so that the one of the two opposite surfaces of the substrate forms a textured structure. A portion of the original substrate subjected to diffusion treatment serves as a first doped layer, and the remaining original substrate serves as a substrate having a textured structure and having a first surface in contact with the first doped layer as well as a second surface on an opposite side. The texturing treatment includes chemical etching, for example, a mixed solution of potassium hydroxide and hydrogen peroxide may be used to clean the substrate, and specifically, the textured structure conforming to the expectation can be formed by controlling a ratio of concentration of the potassium hydroxide solution to concentration of the hydrogen peroxide solution. In some embodiments, the textured structure may also be formed by methods such as laser etching, mechanical or plasma etching. In the laser etching, the textured structure conforming to the expectation is obtained by controlling laser process parameters.

In some embodiments, texturing treatment is performed on two opposite surfaces of the original substrate, and then one of the two opposite surfaces of the original substrate is subjected to diffusion treatment. A portion of the original substrate after being subjected to the diffusion treatment serves as a first doped layer, and the other of the two opposite surfaces is polished, and the remaining original substrate serves as a substrate having a textured structure and having a first surface in contact with the first doped layer as well as a second surface having been subjected to the polishing treatment.

The method includes forming a tunneling dielectric layer on a second surface of the substrate.

In some embodiments, the tunneling dielectric layer is formed using a low-pressure atomic layer deposition film growth technique.

The method includes forming a doped semiconductor layer formed on the tunneling dielectric layer, a surface of the doped semiconductor layer facing away from the substrate has a plurality of recesses, and a size of each recess is smaller than a size of any of the protrusion structures.

In some embodiments, an operation of forming the doped semiconductor layer includes forming a semiconductor film on a surface of the substrate and performing doping processing and activation processing on the semiconductor film, so that the semiconductor film is doped with an N-type doping element or a P-type doping element, and a surface of the semiconductor film has recesses. The semiconductor film after being subjected to doping and activation processing serves as the doped semiconductor layer.

In some embodiments, an operation of forming the semiconductor film includes providing first source gas, the first source gas being used for preparing the semiconductor film, and controlling a flow of the first source gas to be in a range of 100 sccm to 1000 sccm and a reaction temperature to be in a range of 500° C. to 650° C.

In some embodiments, a doping process includes providing doping source gas, and performing in-situ doping and diffusion processing on the semiconductor film.

In some embodiments, process parameters of the activation processing include a gas flow rate in a range of 500 sccm to 5000 sccm and a reaction temperature in a range of 800° C. to 1000° C.

Taking the formation of the doped polysilicon layer as an example, the operation of forming the doped polysilicon layer includes forming a layer of amorphous silicon thin film on the surface of the tunneling dielectric layer by using a low pressure chemical vapor deposition (LPCVD) technology, and a flow of the source gas silane used for forming the amorphous silicon is controlled within a range of 100 sccm to 1000 sccm and a reaction temperature is controlled within a range of 500° C. to 650° C.

Then, the doping source gas is provided to perform doping treatment on the amorphous silicon thin film, the doping source gas may be $POCL_3$, and process parameters of the doping process are controlled during the doping process, so that lattice sorting between the doping elements and the amorphous silicon thin film changes, which is a preprocessing for subsequent activation processing.

The doping process and the formation of the semiconductor film may be performed in the same operation, i.e., in-situ doping to form the doped amorphous silicon film.

Finally, activation processing is performed to convert the doped amorphous silicon thin film into a poly-Si ($n^+$) structure, and a surface of the converted doped polysilicon layer has recesses.

The method includes forming a passivation film formed on the doped semiconductor layer, the passivation film having at least one portion formed in at least one of the recesses, and forming electrodes penetrating the passivation film to be in electrical contact with the doped semiconductor layer, and the electrode has at least one portion formed in at least one of the recesses.

In some embodiments, a passivation layer is formed on the first doped layer while forming the passivation film, and fingers are formed while forming the electrodes.

In some embodiments, in the process of forming the electrodes, the doped semiconductor layer includes a plurality of silicon grains. When the silicon grains are in contact with the conductive electrodes, a Schottky contact or an ohmic contact is formed between the silicon grains and the conductive electrodes, and under the action of a lower applied negative voltage, electrons will overcome the interface barrier to be injected into surfaces of the grains to attract positively charged protons, thereby inducing protons to insert into the lattice so as to react to form a polaron state, so that the surfaces of the grains present metal-like conductive properties. The resistance between the protonated grain layer and the unprotonated grains layer is greatly reduced, so that the protonation reaction on the surface of the grains can occur in sequence from bottom to top along the grain accumulation layer. The doped conductive layer has recesses, and a contact area of the conductive electrode and the nanoparticles is increased by increasing the roughness of an inner surface of the doped conductive layer, which is beneficial to surface protonation. The surface protonation of the grains provides a direct electron transport channel between the grains, which is an effective way of electrically connecting the grains, thereby improving the carrier transport efficiency and reducing the resistance between the grains to greatly improve an electrode photocurrent.

Figure 23:
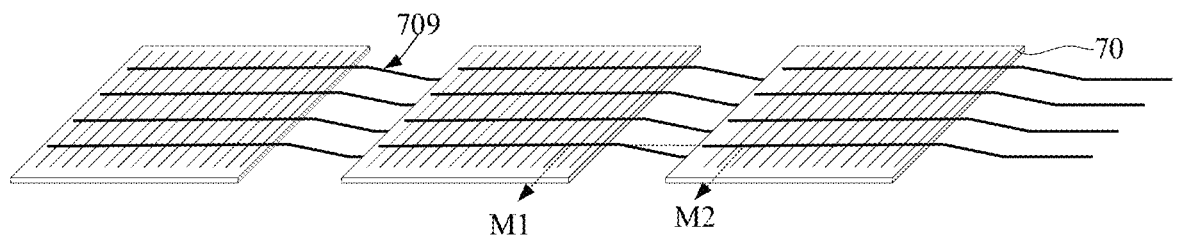
FIG. 23 is a schematic structural diagram of a photovoltaic module according to an embodiment of the present disclosure.
Figure 24:
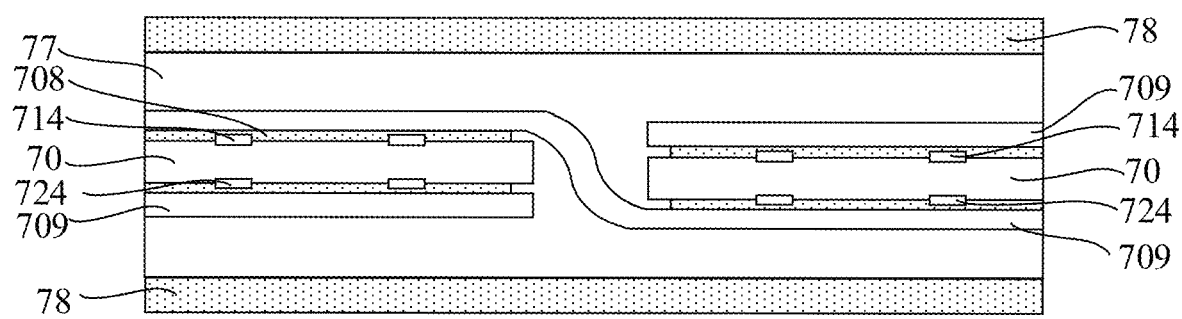
FIG. 24 is a cross-sectional view of FIG. 23 taken along line M1-M2.

FIG. 23 is a schematic structural diagram of a photovoltaic module according to an embodiment of the present disclosure. FIG. 24 is a schematic cross-sectional structural diagram of FIG. 23 taken along line M1-M2.

Some embodiments of the present disclosure provide a photovoltaic module including the solar cell in the above embodiments, and technical features thereof that are the same as or corresponding to those in the above embodiments are not repeated herein.

Referring to FIG. 24, the photovoltaic module includes at least one cell string each formed by connecting a plurality of solar cells 70 according to any one of the above embodiments or a plurality of solar cells prepared by the method according to any one of the above embodiments through at least one connecting member 709, at least one encapsulation layer 77 each configured to cover a surface of a respective cell string, and at least one cover plate 78 each configured to cover a surface of a respective encapsulation layer 77 facing away from the cell string.

Specifically, in some embodiments, the plurality of solar cells are electrically connected by means of the at least one connecting member 709, and the connecting members 709 are welded to busbars 708 on the solar cells.

In some embodiments, a gap is not provided between the solar cells, that is, the solar cells overlap with each other.

In some embodiments, the at least one connection member 709 is welded to fingers on the solar cells, and the fingers include fingers 714 and electrodes 724.

In some embodiments, the at least one encapsulation layer 77 includes a first encapsulation layer and a second encapsulation layer, the first encapsulation layer covers one of the front surface or the rear surface of the solar cell, and the second encapsulation layer covers the other of the front surface or the rear surface of the solar cell. Specifically, at least one of the first encapsulation layer or the second encapsulation layer may be an organic encapsulation adhesive film such as polyvinyl butyral (PVB) adhesive film, ethylene-vinyl acetate copolymer (EVA) adhesive film, polyethylene octene co-elastomer (POE) adhesive film or polyethylene terephthalate (PET) adhesive film.

It should be noted that the first encapsulation layer and the second encapsulation layer have a boundary before lamination processing, and the photovoltaic module formed after the lamination processing does not have the so-called first encapsulation layer and second encapsulation layer, that is, the first encapsulation layer and the second encapsulation layer have formed an integral encapsulation layer 77.

In some embodiments, the at least one cover plate 78 may be a cover plate having a light-transmitting function, such as a glass cover plate and a plastic cover plate. Specifically, a surface of the cover plate 78 facing the encapsulation layer 77 may be a concave-convex surface, thereby increasing the utilization rate of incident light. The at least one cover plate 78 includes a first cover plate and a second cover plate, the first cover plate faces the first encapsulation layer and the second cover plate faces the second encapsulation layer, or, the first cover plate faces one side of the solar cell and the second cover plate faces the other side of the solar cell.

Although the present disclosure is disclosed in the above embodiments, and the above embodiments are not intended to limit the claims. A person skilled in the art may make several possible variations and modifications without departing from the concept of the present disclosure, and therefore, the protection scope of the present disclosure shall be subject to the scope defined by the claims of the present disclosure. In addition, the embodiments of the specification and the accompanying drawings in the present disclosure are merely illustrative and do not cover full protection scope of the claims of the present disclosure.

Any person of ordinary skill in the art can understand that the above embodiments are specific embodiments for realizing the present disclosure. In practical application, various changes may be made thereto in form and details without departing from the scope of the present disclosure. Any person skilled in the art may make various changes and modifications without departing from the scope of the present disclosure, and therefore the protection scope of the present disclosure shall be subject to the scope defined in the claims.

What is claimed is:

1. A solar cell, comprising:
    a substrate having a first surface and a second surface opposite to each other, wherein the first surface has a textured structure, and the textured structure includes protrusion structures;
    at least one doped semiconductor layer each formed over one of the first surface and the second surface, wherein the at least one doped semiconductor layer has a surface facing away from the substrate and provided with recesses, and each of the recesses has a size that is smaller than a size of any of the protrusion structures;
    at least one passivation film, a respective passivation film of the at least one passivation film being formed on a respective doped semiconductor layer of the at least one doped semiconductor layer and having at least one portion formed in at least one of the recesses of the respective doped semiconductor layer; and
    electrodes penetrating the respective passivation film to be in electrical contact with the respective doped semiconductor layer, wherein the electrodes have at least one portion formed in at least one of the recesses of the respective doped semiconductor layer.

2. The solar cell according to claim 1, wherein the recesses have orthographic projections on one of the first surface and the second surface, the orthographic projections having a first area, and the surface of the doped semiconductor layer has an orthographic projection on one of the first surface and the second surface, the orthographic projection having a second area;
    and wherein the first area and the second area has a ratio in a range of 5% to 80%.

3. The solar cell according to claim 1, wherein the respective doped semiconductor layer has a material including polysilicon, monocrystalline silicon, nanocrystalline silicon, amorphous silicon, or microcrystalline silicon.

4. The solar cell according to claim 1, wherein the respective doped semiconductor layer has a thickness in a range of 10 nm to 200 nm.

5. The solar cell according to claim 4, wherein the size of each of the recesses includes a one-dimensional size of an orthographic projection of each of the recesses on a surface of the respective doped semiconductor layer facing the substrate, and the one-dimensional size is in a range of 5 nm to 100 nm.

6. The solar cell according to claim 4, wherein each of the recesses has a depth in a range of 5 nm to 100 nm.

7. The solar cell according to claim 1, wherein the doped semiconductor layer includes silicon grains, and a junction of two adjacent silicon grains has respective ones of the recesses.

8. The solar cell according to claim 7, wherein each of the silicon grains has a sheet shape or a block shape.

9. The solar cell according to claim 1, wherein the at least one doped semiconductor layer includes a first doped conductive film and a second doped conductive film, the first doped conductive film is formed on the textured structure, and the second doped conductive film is formed over the second surface; and wherein at least one of the first doped conductive film and the second doped conductive film has the recesses.

10. The solar cell according to claim 1, wherein the at least one doped semiconductor layer includes a first doped conductive film and a second doped conductive film, and the first doped conductive film and the second doped conductive film are alternatingly formed over the second surface; and wherein at least one of the first doped conductive film and the second doped conductive film has the recesses.

11. The solar cell according to claim 9, wherein the first doped conductive film is doped with one of an N-type doping element and a P-type doping element, and the second doped conductive film is doped with one of the N-type doping element and the P-type doping element.

12. The solar cell according to claim 11, wherein the first doped conductive film has a material that is different from a material of the second doped conductive film, and the second doped conductive film and the substrate have a same conductive type of doping elements.

13. The solar cell according to claim 11, further comprising: a first dielectric layer formed between the second doped conductive film and the second surface, and a second dielectric layer formed between the first doped conductive film and the substrate.

14. The solar cell according to claim 13, wherein at least one of the first dielectric layer and the second dielectric layer has a material including silicon oxide, amorphous silicon, microcrystalline silicon, nanocrystalline silicon, or silicon carbide.

15. The solar cell according to claim 9, wherein the first doped conductive film has a thickness that is less than or equal to a thickness of the second doped conductive film.

16. A photovoltaic module, comprising:
at least one cell string each formed by connecting a plurality of solar cells through at least one connecting member;
at least one encapsulation layer each configured to cover a surface of a respective cell string; and
at least one cover plate each configured to cover a surface of a respective encapsulation layer facing away from the respective cell string;
wherein each of the plurality of solar cells includes:
a substrate having a first surface and a second surface opposite to each other, wherein the first surface has a textured structure, and the textured structure includes protrusion structures;
at least one doped semiconductor layer each formed over one of the first surface and the second surface, wherein each of the at least one doped semiconductor layer has a surface facing away from the substrate and provided with recesses, and each of the recesses has a size that is smaller than a size of any of the protrusion structures;
at least one passivation film, a respective passivation film of the at least one passivation film being formed on a respective doped semiconductor layer of the at least one doped semiconductor layer and having at least one portion formed in at least one of the recesses of the respective doped semiconductor layer; and
electrodes penetrating the respective passivation film to be in electrical contact with the respective doped semiconductor layer, wherein the electrodes have at least one portion formed in at least one of the recesses of the respective doped semiconductor layer.

17. The photovoltaic module according to claim 16, wherein the recesses have orthographic projections on one of the first surface and the second surface, the orthographic projections having a first area, and the surface of the doped semiconductor layer has an orthographic projection on one of the first surface and the second surface, the orthographic projection having a second area; and wherein the first area and the second area has a ratio in a range of 5% to 80%.

18. The photovoltaic module according to claim 16, wherein the respective doped semiconductor layer has a material including polysilicon, monocrystalline silicon, nanocrystalline silicon, amorphous silicon, or microcrystalline silicon.

19. The photovoltaic module according to claim 16, wherein the respective doped semiconductor layer has a thickness in a range of 10 nm to 200 nm.

* * * * *